United States Patent
Ohsawa et al.

(10) Patent No.: US 9,559,325 B2
(45) Date of Patent: Jan. 31, 2017

(54) LIGHT-EMITTING DEVICE HAVING STACKED LIGHT-EMITTING LAYERS

(71) Applicant: Semiconductor Energy Laboratory Co., Ltd., Kanagawa-ken (JP)

(72) Inventors: Nobuharu Ohsawa, Tochigi (JP); Toshiki Sasaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/794,512

(22) Filed: Jul. 8, 2015

(65) Prior Publication Data

US 2015/0311465 A1    Oct. 29, 2015

Related U.S. Application Data

(63) Continuation of application No. 13/456,477, filed on Apr. 26, 2012, now Pat. No. 9,083,000.

(30) Foreign Application Priority Data

Apr. 29, 2011  (JP) ................. 2011-102547

(51) Int. Cl.
*H01L 51/50*    (2006.01)
*H01L 51/52*    (2006.01)
(Continued)

(52) U.S. Cl.
CPC .......... *H01L 51/5044* (2013.01); *H01L 33/08* (2013.01); *H01L 33/405* (2013.01); *H01L 33/42* (2013.01); *H01L 33/507* (2013.01); *H01L 51/5206* (2013.01); *H01L 51/5221* (2013.01); *H01L 51/5265* (2013.01); *H01L 2251/301* (2013.01); *H01L 2251/308* (2013.01)

(58) Field of Classification Search
CPC ........ H01L 33/08; H01L 33/405; H01L 33/42; H01L 33/507; H01L 51/504; H01L 51/5044
See application file for complete search history.

(56) References Cited

U.S. PATENT DOCUMENTS 6,639,250 B1    10/2003  Shimoda et al.
6,847,163 B1     1/2005  Tsutsui et al.
(Continued)

FOREIGN PATENT DOCUMENTS

JP    2006-165271 A    6/2006
JP    2007-053090 A    3/2007
(Continued)

*Primary Examiner* — Kevin Parendo
(74) *Attorney, Agent, or Firm* — Husch Blackwell LLP

(57) ABSTRACT

Disclosed is a light-emitting element with a microcavity structure which is capable of amplifying a plurality of wavelengths to give emission of a desired color. The light-emitting element includes a pair of electrodes and an EL layer having a light-emitting substance interposed between the pair of electrodes. One of the pair of electrodes gives a reflective surface and the other electrode gives a semi-reflective surface. The light-emitting element is arranged so that the emission of the light-emitting substance covers at least two wavelengths $\lambda$ and an optical path length L between the reflective surface and the semi-reflective surface satisfies an equation $L=n\lambda/2$ where n is an integer greater than or equal to 2.

16 Claims, 8 Drawing Sheets

(51) Int. Cl.
  *H01L 33/08* (2010.01)
  *H01L 33/42* (2010.01)
  *H01L 33/50* (2010.01)
  *H01L 33/40* (2010.01)

(56) References Cited

U.S. PATENT DOCUMENTS

| | | | |
|---|---|---|---|
| 7,128,632 B2 | 10/2006 | Nakamura | |
| 7,462,883 B2 | 12/2008 | Kumaki et al. | |
| 7,554,265 B2 | 6/2009 | Godo et al. | |
| 7,564,052 B2 | 7/2009 | Kumaki et al. | |
| 7,601,988 B2 | 10/2009 | Seo et al. | |
| 7,649,197 B2 | 1/2010 | Iwaki et al. | |
| 7,732,808 B2 | 6/2010 | Ikeda et al. | |
| 7,737,626 B2 | 6/2010 | Kumaki et al. | |
| 7,851,989 B2 | 12/2010 | Noda | |
| 7,875,893 B2 | 1/2011 | Seo et al. | |
| 7,893,427 B2 | 2/2011 | Kumaki et al. | |
| 7,948,172 B2 | 5/2011 | Cok et al. | |
| 7,964,891 B2 | 6/2011 | Kumaki et al. | |
| 8,008,652 B2 | 8/2011 | Kumaki et al. | |
| 8,405,098 B2 | 3/2013 | Matsunami et al. | |
| 2003/0189401 A1 | 10/2003 | Kido et al. | |
| 2005/0162075 A1 | 7/2005 | Madathil et al. | |
| 2005/0236981 A1 | 10/2005 | Cok et al. | |
| 2006/0163597 A1 | 7/2006 | Noda et al. | |
| 2006/0284204 A1 | 12/2006 | Yamazaki et al. | |
| 2007/0001570 A1 | 1/2007 | Nomura et al. | |
| 2007/0024168 A1* | 2/2007 | Nishimura | C09K 11/06 313/110 |
| 2007/0029539 A1 | 2/2007 | Yashima et al. | |
| 2007/0035243 A1* | 2/2007 | Lee | C09K 11/06 313/506 |
| 2007/0145350 A1* | 6/2007 | Kobori | H01L 27/322 257/13 |
| 2007/0176161 A1 | 8/2007 | Seo et al. | |
| 2008/0038584 A1 | 2/2008 | Akai | |
| 2008/0241586 A1 | 10/2008 | Kumaki et al. | |
| 2009/0103161 A1 | 4/2009 | Kothari et al. | |
| 2009/0275161 A1 | 11/2009 | Kumaki et al. | |
| 2010/0013740 A1 | 1/2010 | Tanaka et al. | |
| 2010/0096627 A1 | 4/2010 | Ikeda et al. | |
| 2010/0187518 A1 | 7/2010 | Yamauchi et al. | |
| 2010/0200883 A1 | 8/2010 | Sato | |
| 2010/0207518 A1 | 8/2010 | Ikeda et al. | |
| 2010/0314648 A1* | 12/2010 | Fehrer | H01L 51/5044 257/98 |
| 2011/0062427 A1 | 3/2011 | Jeong et al. | |
| 2011/0074272 A1 | 3/2011 | Sakamoto et al. | |
| 2011/0101345 A1 | 5/2011 | Kumaki et al. | |
| 2011/0101380 A1 | 5/2011 | Kumaki et al. | |
| 2011/0108864 A1 | 5/2011 | Seo et al. | |
| 2011/0114981 A1 | 5/2011 | Higaki et al. | |
| 2011/0140101 A1 | 6/2011 | Noda | |
| 2011/0187261 A1* | 8/2011 | Fukuda | H01K 1/26 313/114 |
| 2011/0241007 A1 | 10/2011 | Kumaki et al. | |
| 2011/0278562 A1 | 11/2011 | Kumaki et al. | |
| 2011/0291088 A1 | 12/2011 | Seo et al. | |
| 2011/0309351 A1 | 12/2011 | Kumaki et al. | |
| 2011/0317429 A1 | 12/2011 | Aiba et al. | |
| 2012/0205685 A1* | 8/2012 | Seo | H01L 51/5044 257/89 |
| 2012/0205701 A1 | 8/2012 | Sasaki et al. | |
| 2012/0248474 A1* | 10/2012 | Ebihara | H01L 27/3209 257/89 |

FOREIGN PATENT DOCUMENTS

| | | |
|---|---|---|
| JP | 2007-066883 A | 3/2007 |
| JP | 2009-301731 A | 12/2009 |
| JP | 2010-003577 A | 1/2010 |
| JP | 2010-015787 A | 1/2010 |
| JP | 2010-287484 A | 12/2010 |
| JP | 2010-541160 | 12/2010 |
| WO | WO 2009/045273 A2 | 4/2009 |

* cited by examiner

LIGHT-EMITTING DEVICE HAVING STACKED LIGHT-EMITTING LAYERS

This application is a continuation of copending U.S. application Ser. No. 13/456,477, filed on Apr. 26, 2012 which is incorporated herein by reference.

BACKGROUND OF THE INVENTION

1. Field of the Invention

The present invention relates to a light-emitting element which includes a light-emitting layer containing an organic compound between a pair of electrodes, and a light-emitting device and a lighting device each including the light-emitting element.

2. Description of the Related Art

In recent years, a light-emitting element (also referred to as electroluminescent (EL) element) which includes a light-emitting layer (hereinafter also referred to as EL layer) containing an organic compound between a pair of electrodes has been actively developed. Lighting has attracted attention as one of the application fields of the light-emitting element. This is because a lighting device including the EL element has features different from those of other lighting devices; for example, the lighting device including the EL element can be thin and lightweight and can emit light from a surface having two dimensions.

In addition, an EL element has attracted attention also in terms of its high efficiency of conversion from electrical power into light and its high potential for saving energy. It is also a unique feature of an EL element that, depending on a substrate selected, it is possible to provide a lighting device having flexibility, a lighting device having high resistance against impact such as physical destruction, or a very lightweight lighting device.

Japanese Industrial Standards (JIS) defines the color of lighting on the basis of correlated color temperature. Light with color temperatures ranging from 2600 K to 7100 K, from incandescent color with the lowest color temperature to daylight color with the highest color temperature, is defined as light for room lighting. Light of a variety of colors can be emitted from an EL element by selection of a light-emitting substance. However, light represented by such a color temperature generally has a wide wavelength, and it is very difficult to obtain light which satisfies the standard and the luminance and reliability required for lighting at the same time by using one light-emitting substance. In view of the above, an EL element in which a plurality of light-emitting substances with different emission wavelengths are used so that favorable white light emission can be obtained has been studied (e.g., see Patent Document 1).

REFERENCE

[Patent Document 1] Japanese Published Patent Application No. 2007-53090

SUMMARY OF THE INVENTION

Light emitted inside a light-emitting element travels through many layers until the light radiates from the light-emitting element. At this time light is reflected between layers with different refractive indexes as well as at an interface with a material having high reflectance.

When the reflection is repeated, in some cases, light with a particular wavelength is intensified, that is, a so-called microcavity effect becomes conspicuous. A microcavity is a phenomenon in which light with a particular wavelength is intensified, and therefore is actively used especially for a display for which high color purity is required. However, since a microcavity structure of an EL element having an EL layer with a normal thickness has a single mode, light with only one wavelength can be intensified; thus, it is difficult to apply the microcavity structure to a lighting device which needs to widely cover the visible region.

In view of the above, it is an object of one embodiment of the present invention to provide a light-emitting element with a microcavity structure, which is capable of amplifying a plurality of wavelengths to provide a desired emission color.

It is an object of one embodiment of the present invention to provide a light-emitting element which is favorably applied to lighting.

It is an object of one embodiment of the present invention to provide a lighting device with a color temperature suitable for lighting. It is an object of one embodiment of the present invention to provide a lighting device with low power consumption.

The present invention achieves at least one of the above objects.

The inventors have found out that by setting the optical thickness of an EL element to a certain thickness or more, a resonant structure is formed for light with a plurality of wavelengths to achieve the above objects. One embodiment of the present invention is a light-emitting element including a pair of electrodes and an EL layer interposed between the pair of electrodes. One of the pair of electrodes is a reflective electrode which gives a reflective surface, and the other of the pair of electrodes is an electrode which gives a semi-reflective surface. A light-emitting substance is included in the EL layer. Further, there are two or more wavelengths $\lambda$, which satisfy the equation, $L=n\lambda/2$ (n is an integer greater than or equal to 2), in the emission wavelength region of the light-emitting substance, where L is the optical path length between the reflective surface and the semi-reflective surface. In other words, the light-emitting element has an optical path length so that an emission spectrum of the light-emitting substance covers at least two wavelengths $\lambda$ that satisfy the equation $L=n\lambda/2$.

Another embodiment of the present invention is a light-emitting element including a pair of electrodes and an EL layer interposed between the pair of electrodes. One of the pair of electrodes is a reflective electrode which gives a reflective surface, and the other of the pair of electrodes is an electrode which gives a semi-reflective surface. The EL layer includes at least a red-light-emitting layer, a blue-light-emitting layer, and a thickness adjustment layer. The optical path length of a resonant structure formed between the reflective surface and the semi-reflective surface in the light-emitting element is 650 nm to 1500 nm.

Another embodiment of the present invention is a light-emitting element including a pair of electrodes and an EL layer interposed between the pair of electrodes. One of the pair of electrodes is a reflective electrode which gives a reflective surface, and the other of the pair of electrodes is an electrode which gives a semi-reflective surface. The EL layer includes at least a red-light-emitting layer, a green-light-emitting layer, a blue-light-emitting layer, and a thickness adjustment layer. The optical path length of a resonant structure formed between the reflective surface and the semi-reflective surface in the light-emitting element is 650 nm to 1500 nm.

One embodiment of the present invention is a light-emitting element including a pair of electrodes and an EL layer interposed between the pair of electrodes. One of the pair of electrodes is a reflective electrode which gives a reflective surface, and the other of the pair of electrodes is an electrode which gives a semi-reflective surface. The EL layer includes at least a red-light-emitting layer, a green-light-emitting layer, a blue-light-emitting layer, and a thickness adjustment layer. The optical path length of a resonant structure fainted between the reflective surface and the semi-reflective surface in the light-emitting element is 1200 nm to 1400 nm.

In the light-emitting element according to one embodiment of the present invention, the blue-light-emitting layer has an emission peak at a wavelength of 430 nm to 495 nm, and the red-light-emitting layer has an emission peak at a wavelength of 590 nm to 700 nm.

In the light-emitting element according to one embodiment of the present invention, the green-light-emitting layer may have an emission peak at a wavelength of 495 nm to 560 nm.

In the light-emitting element according to one embodiment of the present invention, the electrode which gives the semi-reflective surface may be a thin metal film.

In the light-emitting element according to one embodiment of the present invention, the electrode which gives the semi-reflective surface may be an electrode formed using a light-transmitting conductive metal oxide.

In the light-emitting element according to one embodiment of the present invention, the electrode which gives the semi-reflective surface may be an electrode formed of a stack of a thin metal film and a light-transmitting conductive metal oxide.

In the light-emitting element according to one embodiment of the present invention, the thickness adjustment layer may be provided in contact with the reflective electrode.

In the light-emitting element according to one embodiment of the present invention, the EL layer includes a plurality of light-emitting units each of which includes at least one of the light-emitting layers, and the plurality of light-emitting units may be separated by a charge generation layer.

In the light-emitting element according to one embodiment of the present invention, at least part of the charge generation layer may also serve as the thickness adjustment layer.

In the light-emitting element according to one embodiment of the present invention, the thickness adjustment layer may be formed using one of or both a light-transmitting conductive metal oxide and a composite material of an organic compound having a carrier-transport property and a substance exhibiting an acceptor property or a donor property with respect to the organic compound.

In the light-emitting element according to one embodiment of the present invention, the composite material may be a composite material of an organic compound having a high hole-transport property and a substance exhibiting an acceptor property with respect to the organic compound.

In the light-emitting element according to one embodiment of the present invention, the substance exhibiting an acceptor property may be an oxide of a transition metal.

In the light-emitting element according to one embodiment of the present invention, the oxide of the transition metal may be molybdenum oxide.

Another embodiment of the present invention is a light-emitting device in which the light-emitting element according to one embodiment of the present invention is sealed between a supporting substrate and a sealing substrate with a sealing material therebetween.

In the light-emitting device according to one embodiment of the present invention, the light-emitting element is fixed to the sealing substrate on the reflective electrode side.

In the light-emitting device according to one embodiment of the present invention, the supporting substrate may be formed using a material with high thermal conductivity or a structure body containing a material with high thermal conductivity.

In the light-emitting device according to one embodiment of the present invention, the material with high thermal conductivity may be any one of aluminum, duralumin, and stainless steel, or a stack of any of these.

In the light-emitting device according to one embodiment of the present invention, a light-transmitting film with a refractive index greater than or equal to 1 and less than or equal to 2.3 may be formed so as to cover a surface of the semi-transmissive and semi-reflective electrode, which is opposite to a surface in contact with the EL layer.

In the light-emitting device according to one embodiment of the present invention, a member diffusing light may be provided outside the supporting substrate or the sealing substrate which is on the side where the electrode giving the semi-reflective surface is provided.

Another embodiment of the present invention is a lighting device including the light-emitting device according to one embodiment of the present invention.

The light-emitting element according to one embodiment of the present invention has a multimode microcavity structure which is capable of amplifying light with a plurality of wavelengths to result in a desired emission color.

The lighting device according to one embodiment of the present invention is a lighting device which shows a color temperature suitable for lighting and has low power consumption.

DETAILED DESCRIPTION OF THE INVENTION

Figure 1A:
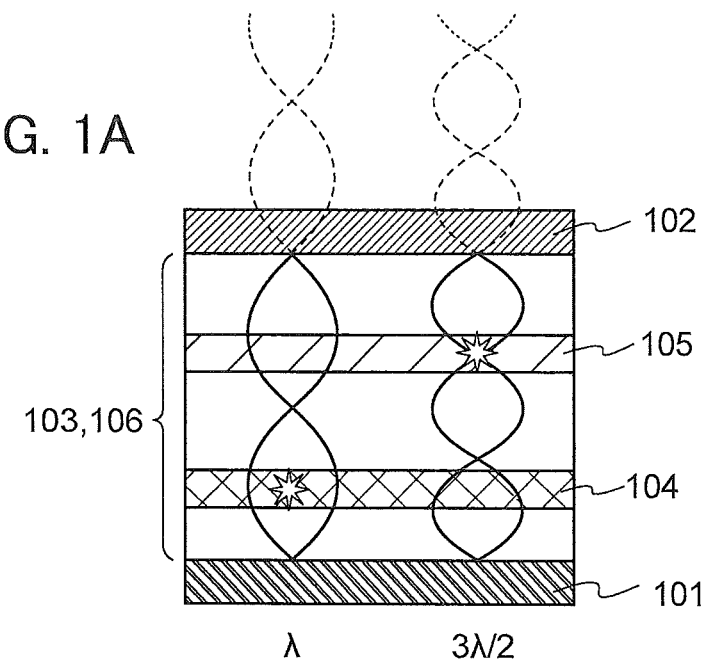
FIGS. 1A and 1B are each a conceptual diagram of a light-emitting element according to one embodiment of the present invention.

Embodiments and Example of the present invention will be described below with reference to the accompanying drawings. Note that the present invention can be carried out in many different modes and it is easily understood by those skilled in the art that modes and details of the present invention can be modified in a variety of ways without departing from the sprit and scope of the present invention. Therefore, the present invention is not construed as being limited to the description of the embodiments and example.

Note that for the sake of simplification, the magnification ratio and the reduction ratio of each component in drawings are not fixed. Thus, the ratios of the thicknesses, the lengths, and the sizes of components in the drawings are not necessarily reflected on the ratios of the thicknesses, the lengths, and the sizes of a light-emitting device according to one embodiment of the present invention.

As for the reference numerals, the same numbers with different alphabets are considered as being in the same group in some cases. In the case where only the number is shown, the number indicates the group of the components with the same numbers with different alphabets.

Embodiment 1

Figure 1B:
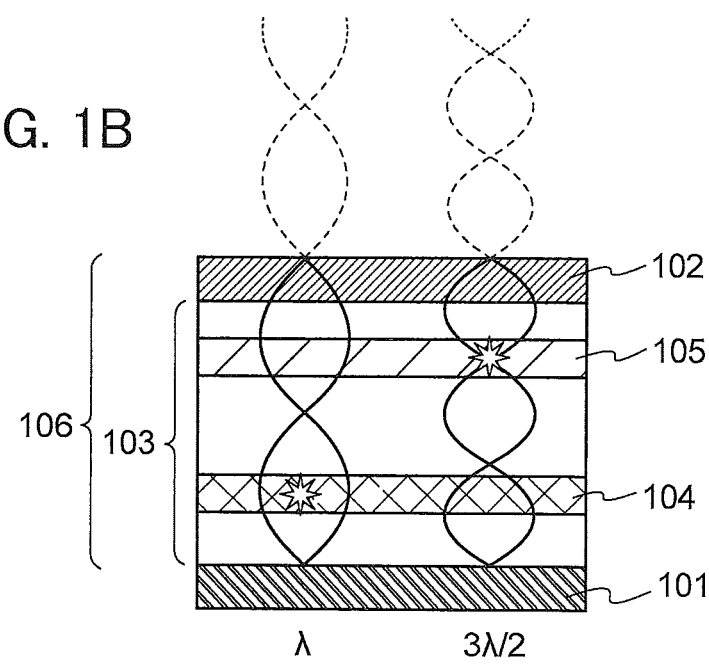

FIGS. 1A and 1B are each a schematic cross-sectional view of a light-emitting element according to one embodiment of the present invention. The light-emitting elements described in this embodiment each include an EL layer interposed between a pair of electrodes. The EL layer includes a plurality of layers having different functions and includes at least a light-emitting layer which emits light by being supplied with current.

FIG. 1A will be described. One of the pair of electrodes (a first electrode 101 and a second electrode 102) is an anode, and the other is a cathode. The one of the pair of electrodes is a reflective electrode formed using a substance with high visible-light reflectance, and the other is a semi-transmissive and semi-reflective electrode formed using a material which transmits part of visible light and reflects part of visible light. A reflective surface and a semi-reflective surface between which a resonant structure 106 is formed respectively correspond to a surface of the reflective electrode, which is on an EL layer 103 side, and a surface of the semi-transmissive and semi-reflective electrode, which is on the EL layer 103 side. In the light-emitting element illustrated in FIG. 1A, the pair of electrodes is formed of the reflective electrode and the semi-transmissive and semi-reflective electrode, whereby the resonant structure 106 is formed between the top surface of the reflective electrode and the bottom surface of the semi-transmissive and semi-reflective electrode, and the light-emitting element has a microcavity structure in which light with a specific wavelength can be amplified or attenuated.

In this case, the semi-transmissive and semi-reflective electrode is formed using a metal, and thus has higher conductivity than a transparent conductive film such as an indium tin oxide (ITO) film which is used as a transparent electrode; thus, variation in luminance in an emission surface due to voltage drop can be reduced. In FIG. 1A, the first electrode 101 serves as an anode and a reflective electrode, and the second electrode 102 serves as a cathode and a semi-transmissive and semi-reflective electrode. Note that the combination of and positional relation between these electrodes can be freely determined. However, a combination and positional relation to give a top-emission structure is particularly preferable.

The EL layer 103 may have any structure as long as the EL layer 103 emits light when voltage is applied between the first electrode 101 and the second electrode 102. However, the EL layer 103 includes a light-emitting layer emitting light with at least two wavelengths $\lambda$ which satisfy the equation $L=n\lambda/2$ (n is an integer greater than or equal to 2) where L is the optical path length of the resonant structure 106. Moreover, the optical path length L is 650 nm to 1500 nm. FIG. 1A illustrates an example in which a light-emitting layer 104 and a light-emitting layer 105 are provided, the light-emitting layer 104 emits light including a wavelength $\lambda_1$ satisfying the equation for the optical path length L of the resonant structure 106, $L=2\times\lambda_1/2$, and the light-emitting layer 105 emits light including a wavelength $\lambda_2$ satisfying $L=3\times\lambda_2/2$.

The EL layer 103 preferably includes a red-light-emitting layer whose emission can be regarded as red and a blue-light-emitting layer whose emission can be regarded as blue, more preferably further includes a green-light-emitting layer whose emission can be regarded as green. As for these light-emitting layers, one light-emitting layer may function as a plurality of light-emitting layers. For instance, one light-emitting layer whose emission is included in the wavelength ranges for both red and blue light can be substituted for the red-light-emitting layer and the blue-light-emitting layer.

Note that the optical path length L of the resonant structure 106 in FIG. 1A is greater than or equal to 650 nm and less than or equal to 1500 nm. Note that the optical path length is the sum of values obtained by multiplying a thickness of each of the films in the resonant structure 106 by its refractive index.

In this specification, light emitted from the blue-light-emitting layer has an emission peak at a wavelength of 430 nm to 495 nm, light emitted from the green-light-emitting layer has an emission peak at a wavelength of 495 nm to 560 nm, and light emitted from the red-light-emitting layer has an emission peak at a wavelength of 590 nm to 700 nm.

Here, the EL layer 103 includes a thickness adjustment layer. In the light-emitting element in this embodiment, the optical thickness of the EL layer ranges from 650 nm to 1500 nm; thus, the light-emitting element is much thicker than a normal light-emitting element. Thus, when the light-emitting element with such a large thickness is manufactured using only an organic compound which is normally used, the driving voltage is significantly increased. By using the thickness adjustment layer, the thickness of the thick light-emitting element of this embodiment can be adjusted without causing a great increase in the driving voltage.

A light-transmitting metal oxide can be used for the thickness adjustment layer. Examples of the light-transmitting metal oxide include indium oxide ($In_2O_3$), tin oxide ($SnO_2$), zinc oxide (ZnO), ITO, indium oxide-zinc oxide ($In_2O_3$—ZnO), and such a metal oxide material in which silicon oxide is contained. A film of a composite material of a substance having a high carrier-transport property and a substance exhibiting an acceptor property or a donor property with respect to the substance having a high carrier-transport property can also be favorably used as the thickness adjustment layer.

The composite material of a substance having a carrier-transport property and a substance exhibiting an acceptor property or a donor property with respect to the substance having a carrier-transport property is broadly classified into a composite material of a substance having a high hole-transport property and a substance exhibiting an acceptor property with respect to the substance and a composite material of a substance having a high electron-transport property and a substance exhibiting a donor property with respect to the substance.

First, the composite material of a substance having a high hole-transport property and a substance exhibiting an acceptor property with respect to the substance will be described.

As examples of the substance exhibiting an acceptor property in the composite material, 7,7,8,8-tetracyano-2,3,5,6-tetrafluoroquinodimethane (abbreviation: F$_4$-TCNQ), chloranil, and the like can be given. In addition, oxides of transition metals, in particular, oxides of metals belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is particularly preferable because it is stable in the air, has a low hygroscopic property, and is easily handled.

As examples of the substance having a high hole-transport property that can be used for the composite material, a variety of compounds such as an aromatic amine compound, a carbazole derivative, an aromatic hydrocarbon, and a polymer including an oligomer and a dendrimer, can be given. Although any substance can be used as long as the substance has a hole-transport property higher than an electron-transport property, a substance having a hole mobility of $10^{-6}$ cm$^2$/Vs or higher is preferably used. Specific examples of the organic compound that can be used for the composite material are given below.

As examples of the aromatic amine compound that can be used for the composite material, the following can be given: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), 4-phenyl-4'-(9-phenylfluoren-9-yl)triphenylamine (abbreviation: BPAFLP), and the like.

As specific examples of the carbazole derivative that can be used for the composite material, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. As other examples of the carbazole derivatives, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), 1,4-bis[4-(N-carbazolyl)phenyl]-2,3,5,6-tetraphenylbenzene, and the like.

As examples of the aromatic hydrocarbon that can be used for the composite material, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl; anthracene, tetracene, rubrene, perylene, 2,5,8,11-tetra(tert-butyl)perylene, and the like. Other than these examples, pentacene, coronene, or the like can be used. As given above, an aromatic hydrocarbon which has a hole mobility of $1 \times 10^{-6}$ cm$^2$/Vs or higher and has 14 to 42 carbon atoms is more preferable.

The aromatic hydrocarbon that can be used for the composite material may have a vinyl skeleton. As examples of the aromatic hydrocarbon having a vinyl group, the following are given: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: poly-TPD) can also be used.

The thickness adjustment layer which is formed using the composite material of a substance having a high hole-transport property and a substance exhibiting an acceptor property with respect to the substance has an excellent hole-transport property and hole-injection property, and thus is preferably provided in contact with the anode.

Next, the composite material of a substance having a high electron-transport property and a substance exhibiting a donor property with respect to the substance will be described.

As the substance exhibiting a donor property, an alkali metal, an alkaline earth metal, and a compound thereof can be used.

Examples of the substance having a high electron-transport property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq). A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato] zinc (abbreviation: Zn(BTZ)$_2$), or the like can also be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly ones that have an electron mobility of $10^{-6}$ cm$^2$/Vs or higher. Note that any substance other than the above substances may be used as long as it is a substance having an electron-transport property higher than a hole-transport property.

The thickness adjustment layer which is formed using the composite material layer of the substance having a high electron-transport property and the substance exhibiting a donor property with respect to the substance has an excellent electron-transport property and electron-injection property, and thus is preferably provided in contact with the cathode.

The light-emitting element of this embodiment is a very thick light-emitting element in which the optical path length of the resonant structure exceeds 650 nm. The optical path length of the resonant structure corresponds to the optical path length between the reflective electrode and the semi-transmissive and semi-reflective electrode in FIG. 1A. Light emitted from the light-emitting layer is repeatedly reflected by the reflective electrode and the semi-transmissive and semi-reflective electrode, so that light with a wavelength corresponding to the optical path length is intensified or attenuated. It is known that in the case where such a resonant structure is formed, amplification by resonance is obtained under the condition where the optical path length of the resonant structure is an integral multiple of one-half of a wavelength of light ($m\lambda/2$ in the case where a wavelength is represented by $\lambda$ and an integer is represented by m). Considering that the refractive index of an organic material is 1.7, no more than one $\lambda/2$ wavelength for any color in the visible light region can be applied to a light-emitting element with a normal thickness (approximately 200 nm). However, in the light-emitting element of this embodiment, in which the optical path length of the resonant structure exceeds 650 nm, a resonant structure with plural magnifications can be formed for different wavelengths. In other words, the optical path length 650 nm corresponds to a $3\lambda/2$ wavelength of the wavelength range perceived as blue and a $1\lambda$ wavelength of the wavelength range perceived as red, so that a resonant structure can be formed for the wavelengths of blue and red in the light-emitting element in which the optical thickness is 650 nm. Since green light has a high luminosity factor, the light-emitting element in which the resonant structure is formed for the wavelengths of blue and red can emit white light with excellent balance. Note that the EL layer preferably has a thickness of approximately 1500 nm at most because the manufacturing time becomes too long when the EL layer is too thick.

It is more preferable that the optical path length of the resonant structure of the light-emitting element be from 1290 nm to 1400 nm, and this range corresponds to a $3\lambda$ wavelength of blue, a $5\lambda/2$ wavelength of green, and a $2\lambda$ wavelength of red. A light-emitting element which has a resonant structure having such an optical path length can be a light-emitting element having a resonant structure corresponding to all of the three colors of blue, green, and red. Thus, emission of white light with a desired color can be easily obtained. In addition, the light-emitting element can be a light-emitting element having high emission efficiency.

Although only three colors of blue, green, and red are used in the above description, a resonant structure may be formed for a wavelength of a color other than the three colors. A spectrum from a light-emitting element has a tail in the range of several tens of nanometers around the peak. The formation of a resonant structure for a plurality of wavelengths corresponding to an intermediate color rather than a peak wavelength in the light-emitting element of this embodiment contributes to a broad spectrum like a spectrum of black body radiation. Thus, the resonant structure is preferably applied to lighting in which a color rendering property is also valued.

Further, in the light-emitting element of this embodiment, since the optical path length is very large, the resonant effect can be obtained regardless of the positions of light emission. It is difficult to strictly define the positions of light emission in a light-emitting element because the position of light emission changes also in a light-emitting layer due to carrier balance or the like. However, in the light-emitting element described in this embodiment, an amplification effect can be obtained without regard for the above.

According to one embodiment of the present invention, a light-emitting element which has a microcavity structure corresponding to a plurality of wavelengths can be provided.

Further, the resonant structure for a plurality of wavelengths can be formed by a single element structure without forming a plurality of elements having different resonant structures; thus, a lighting device with an excellent color temperature can be obtained easily.

In the case of FIG. 1B, a reflective surface and a semi-reflective surface between which the resonant structure 106 is formed correspond to a surface of the first electrode 101 that is a reflective electrode and the top surface of the second electrode 102 which correspond to the semi-transmissive and semi-reflective electrode. The reflection at the top surface of the second electrode 102 is caused by the difference in refractive index between the second electrode 102 and a substance over the second electrode 102. In this case, the resonant structure is formed between the top surface of the first electrode 101 and the top surface of the second electrode 102, and not only the EL layer 103 but also the second electrode 102 contributes to the light path length.

In this case, the second electrode 102 is formed using a conductive metal oxide with a light-transmitting property (e.g., transparent conductive metal oxide such as indium oxide ($In_2O_3$), tin oxide ($SnO_2$), zinc oxide (ZnO), ITO, indium oxide-zinc oxide ($In_2O_3$—ZnO), and these metal oxide materials containing silicon oxide).

Note that the second electrode 102 can also be formed of a stack of a metal and a light-transmitting metal oxide.

Further, a light-transmitting substance with a refractive index of 1 to 2.3 can be additionally stacked over the second electrode 102, which corresponds to the semi-transmissive and semi-reflective electrode, in the structure illustrated in FIG. 1B. In this case, the light-transmitting substance may have or does not necessarily have conductivity. As the light-transmitting substance, for example, a substance used as a material for an EL layer, such as the composite material of an organic compound having a carrier-transport property and a substance exhibiting an acceptor property or a donor property with respect to the organic compound, a light-transmitting organic insulating film, or a light-transmitting inorganic insulating film can be used. This structure allows an increase in the optical path length, which enables the formation of a resonant structure corresponding to a larger number of wavelengths.

Embodiment 2

In this embodiment, materials for and a manufacturing method of the EL layer and the electrodes which are described in Embodiment 1 will be described in detail.

Specific examples of the material that can be used for forming the reflective electrode include metal materials such as aluminum (Al), gold (Au), platinum (Pt), nickel (Ni), tungsten (W), chromium (Cr), molybdenum (Mo), iron (Fe), cobalt (Co), copper (Cu), and palladium (Pd), a compound thereof, and an alloy thereof.

In the case where the semi-transmissive and semi-reflective electrode is formed using a metal, the semi-transmissive and semi-reflective electrode can be formed as a thin metal film (the thickness thereof is preferably less than or equal to 20 nm, more preferably less than or equal to 10 nm). As the thin metal film, a single layer or a stacked layer using silver, magnesium, and an alloy containing such a metal material can be used.

In the case where the semi-transmissive and semi-reflective electrode is formed using a light-transmitting conductive metal oxide, indium oxide ($In_2O_3$), tin oxide ($SnO_2$), zinc oxide (ZnO), ITO, indium oxide-zinc oxide (In$_2$O$_3$—ZnO), or such a metal oxide material in which silicon oxide is contained can be used.

Note that the light-transmitting substance with a refractive index of 1 to 2.3, which is stacked over the semi-transmissive and semi-reflective electrode, may have or does not necessarily have conductivity. As the light-transmitting substance, for example, a light-transmitting conductive metal oxide, the composite material of an organic compound having a carrier-transport property and a substance exhibiting an acceptor property or a donor property with respect to the organic compound, which is described in Embodiment 1, a substance used as a material for an EL layer, a light-transmitting organic insulating film, or a light-transmitting inorganic insulating film can be used.

Each of the reflective electrode and the semi-transmissive and semi-reflective electrode (or an electrode formed using a light-transmitting conductive metal oxide) can be either an anode or a cathode. In the case where the work functions of materials for these electrodes do not coincide with the functions as an anode and a cathode, a carrier-injection layer is provided to an interface between an EL layer and the electrode, so that a metal with a low (or high) work function can be used for the anode (or the cathode). A composite material of an organic compound having a high hole-transport property and an acceptor substance can be preferably used for a carrier-injection layer on the anode side. A composite material of an organic compound having a high electron-transport property and a donor substance can be preferably used for a carrier-injection layer on the cathode side. The carrier-injection layers formed using these composite materials can also serve as a thickness adjustment layer.

In the case where a thickness adjustment layer is provided in contact with an anode, the thickness adjustment layer can be formed using a conductive metal oxide. The conductive metal oxide has a high work function and thus easily injects holes into an organic compound. For that reason, the conductive metal oxide can be preferably used for the thickness adjustment layer on the anode side.

An anode 702 and a cathode 704 can each be formed by a known method, for example, a sputtering method, a vacuum evaporation method, an ion plating method, a molecular beam epitaxy (MBE) method, a CVD method (a metal organic CVD (MOCVD) method or an atomic layer deposition (ALD) method), a sol-gel method, a spin coating method, a dipping method, a spray method, a coater method, or a printing method, depending on the material used for the anode 702 and the cathode 704.

There is no particular limitation on the stacked-layer structure of the EL layer 103. The EL layer 103 may be formed by combining, as appropriate, functional layers such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided. Another functional layer may be provided. Such a stacked-layer structure is referred to as a light-emitting unit in some cases.

The light-emitting element of this embodiment includes a light-emitting layer which emits light at least at two wavelengths 2 which satisfy L=nλ/2 (n is an integer greater than or equal to 2) where L is the optical path length between the reflective electrode and the semi-reflective surface.

In this embodiment, a structure of the EL layer 103, in which a hole-injection layer 711, a hole-transport layer 712, a light-emitting layer 713, an electron-transport layer 714, and an electron-injection layer 715 are stacked from the anode 702 side, will be described (see FIG. 2A). A structure of and materials for each layer will be specifically described below.

The hole-injection layer 711 is a layer which is provided in contact with the anode 702 and contains a substance having a high hole-injection property. Molybdenum oxide, vanadium oxide, ruthenium oxide, tungsten oxide, manganese oxide, or the like can be used. Alternatively, the hole-injection layer 711 can be formed using a phthalocyanine-based compound such as phthalocyanine (abbreviation: H$_2$Pc) or copper phthalocyanine (abbreviation: CuPc); an aromatic amine compound such as DPAB or DNTPD; a polymer such as poly(ethylenedioxythiophene)/poly(styrenesulfonic acid) (PEDOT/PSS); or the like.

Alternatively, for the hole-injection layer 711, a composite material in which a substance exhibiting an acceptor property with respect to a substance having a high hole-transport property is contained in the substance having a high hole-transport property may be used. Note that when a layer of the composite material is formed in contact with the anode, a material for forming the anode can be selected regardless of its work function. In other words, besides a material with a high work function, a material with a low work function may be used for the anode. The composite material is similar to the composite material described in Embodiment 1; therefore, the description will not be repeated. Note that in the case where the hole-injection layer 711 is formed using the composite material, the hole-injection layer 711 also serves as a thickness adjustment layer.

The hole-transport layer 712 contains a substance having a high hole-transport property. Examples of the substance having a high hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(Spiro-9,9'-bifluoren-2-yl)-N-phenylamino]biphenyl (abbreviation: BSPB), and BPAFLP. The substances given here are mainly ones that have a hole mobility of 10$^{-6}$ cm$^2$/Vs or higher. Any of the organic compounds given above as examples of the substance having a high hole-transport property in the composite material can also be used for the hole-transport layer 712. Note that any substance other than these substances may be used as long as the substance has a hole-transport property higher than an electron-transport property. Note that the layer containing a substance having a high hole-transport property is not limited to a single layer, and may be a stack of two or more layers containing any of the above substances.

For the hole-transport layer 712, a high molecular compound such as PVK or PVTPA can also be used.

The light-emitting layer 713 is a layer containing a light-emitting substance. The light-emitting layer 713 may be either a light-emitting layer of a single film containing a light-emitting substance as its main component or a so-called host-gate type light-emitting layer in which a light-emitting substance is dispersed in a host material.

There is no particular limitation on the light-emitting substance used, and known fluorescent materials or phosphorescent materials can be used. As examples of the fluorescent material, the following can be given: N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), and materials each having an emission wavelength of 450 nm or more, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N"-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N"-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[      ]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As examples of the phosphorescent material, the following can be given, for example: bis[2-(4',6'-difluorophenyl)pyridinato-N,$C^{2'}$]iridium(III) tetrakis(1-pyrazolyl)borate (abbreviation: FIr6), materials each having an emission wavelength in the range of 470 nm to 500 nm, such as bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III) picolinate (abbreviation: Ir($CF_3$ppy)$_2$(pic)), and bis[2-(4',6'-difluorophenyl)pyridinato-N,$C^{2'}$]iridium(III) acetylacetonate (abbreviation: FIracac), materials each having an emission wavelength of 500 nm or more (materials which emit green light), such as tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$ (acac)), bis(2-phenylbenzothiazolato-N,$C^{2'}$)iridium(III) acetylacetonate (abbreviation: Ir(bt)$_2$(acac)), bis[2-(2'-benzo[4,5-a]thienyl)pyridinato-N,$C^3$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum (II) (abbreviation: PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). Any of the above materials and other known materials may be selected in consideration of the emission color of each EL element.

In the case of using a host material, as examples of the host material, the following can be given: metal complexes such as Alq, BeBq$_2$, BAlq, bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as PBD, OXD-7, TAZ, 2,2',2"-(1,3,5-benzenetriyl)-tris(1-phenyl-1H-benzimidazole) (abbreviation: TPBI), BPhen, BCP, and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include DPAnth, N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, CzPA, 3,6-diphenyl-9-[4-(10-phenyl-9-anthryl)phenyl]-9H-carbazole (abbreviation: DPCzPA), DPPA, DNA, t-BuDNA, 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3). From these materials or other known materials, a material may be selected which has a larger energy gap (or a triplet energy if the material emits phosphorescence) than a light-emitting substance dispersed in the material and which has a transport property needed for the layer.

The light-emitting layer may be a single layer or a stack of light-emitting layers which contain light-emitting substances emitting light of different colors. In the case where the light-emitting layer is a single layer, a plurality of light-emitting substances which emit light with different wavelengths may be contained in the light-emitting layer.

The light-emitting layer may also be a stack of light-emitting layers in which different host materials contain the same emission center material.

The electron-transport layer 714 contains a substance having a high electron-transport property, and the substances having a high electron-transport property, which are exemplified in Embodiment 1, can be given.

The electron-transport layer 714 is not limited to a single layer, and may be a stack of two or more layers containing any of the above substances.

Further, a layer for controlling transport of electrons may be provided between the electron-transport layer 714 and the light-emitting layer 713. Specifically, the layer for controlling transport of electrons is a layer formed by adding a small amount of substance having a high electron trapping property to the above material having a high electron-transport property, and is capable of adjusting carrier balance by suppressing transport of electron carriers. Such a structure is very effective in avoiding a problem (e.g., reduction in element lifetime) caused when electrons pass through the light-emitting layer 713.

For the electron-injection layer 715, an alkali metal, an alkaline earth metal, or a compound thereof, such as lithium fluoride (LiF), cesium fluoride (CsF), or calcium fluoride ($CaF_2$) can be used. Alternatively, a layer of a substance exhibiting an electron-transport property, which includes a substance exhibiting an electron-donating property (typically, an alkali metal, an alkaline earth metal, or a compound thereof) with respect to the substance exhibiting an electron-transport property (the material having a donor level), for example, a layer of Alq containing magnesium (Mg) can be used for the electron-injection layer 715. Note that the structure in which the material having a donor level is used for the electron-injection layer 715 is preferably employed, in which case electrons are injected efficiently from the cathode 704.

Figure 2A:
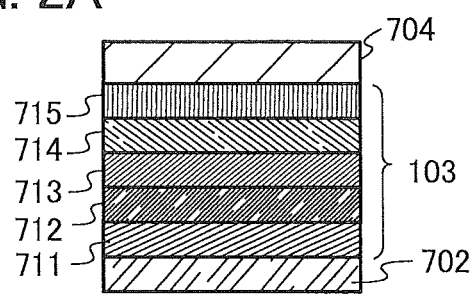
FIGS. 2A and 2B are each a conceptual diagram of a light-emitting element according to one embodiment of the present invention.
Figure 2B:
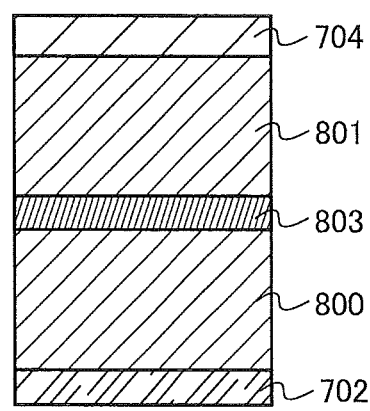

Note that the EL layer 103 may have a structure in which a plurality of light-emitting units are stacked between the anode 702 and the cathode 704 as illustrated in FIG. 2B. In that case, a charge generation layer 803 is preferably provided between a first light-emitting unit 800 and a second light-emitting unit 801 which are stacked. The charge generation layer 803 can be formed using the above-described composite material of an organic compound having a high hole-transport property and a material exhibiting an acceptor property with respect to the organic compound. The charge generation layer 803 may have a stacked-layer structure including a layer containing the composite material and a layer containing another material. In that case, as the layer containing another material, a layer containing a donor substance and a substance having a high electron-transport property, a layer formed using a light-transmitting conductive metal oxide, or the like can be used. The remarkably improved current efficiency of an EL element having such a structure allows the formation of the EL element with high power efficiency and a long lifetime. It is also easy for such a light-emitting element to exhibit phosphorescence from one of the light-emitting units and fluorescence from the other light-emitting unit.

Although FIG. 2B illustrates a structure in which two light-emitting units (the first light-emitting unit 800 and the second light-emitting unit 801) are stacked, three or more light-emitting units may be stacked. In that case, charge generation layers are preferably provided between the light-emitting units. Note that the charge-generation layer 803 also serves as a thickness adjustment layer.

The light-emitting unit has a structure similar to the structure of the EL layer 103 in FIG. 2A. The detailed description of the layers included in the units is given above; therefore, the description will not be repeated. The description of the EL layer 103 in FIG. 2A can be referred to.

In particular, the structure illustrated in FIG. 2B can be preferably applied to the light-emitting element described in Embodiment 1, for which a large thickness is required. Further, the structure makes it possible to obtain light of different colors at the same time, and thus is particularly effective for lighting. The structure makes it possible to obtain a light-emitting device with a color temperature suitable for lighting.

Embodiment 3

Figure 3A:
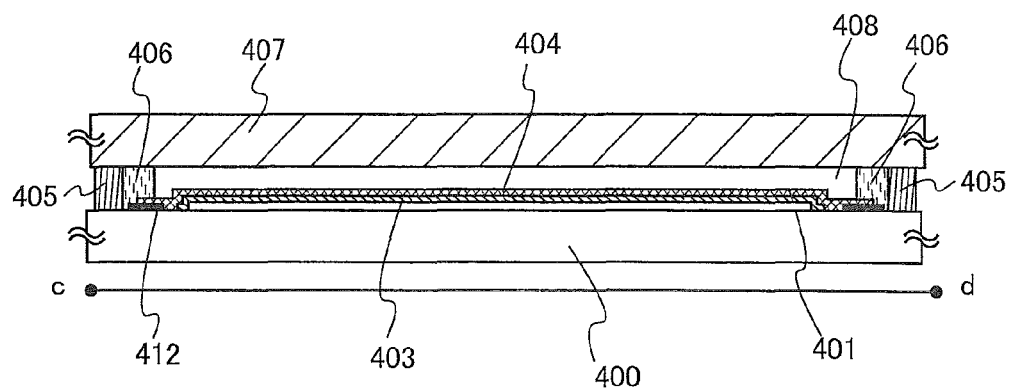
FIGS. 3A and 3B illustrate a lighting device according to one embodiment of the present invention.
Figure 3B:
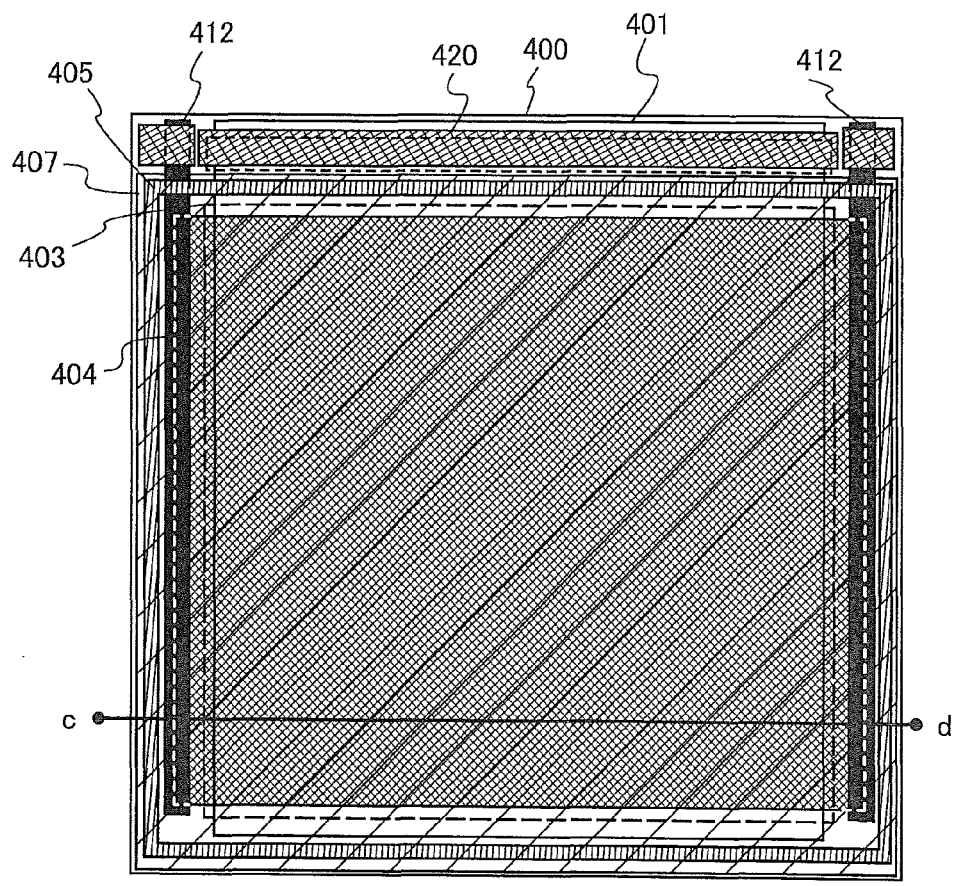

In this embodiment, an example in which the light-emitting element described in Embodiment 1 is used for a lighting device will be described with reference to FIGS. 3A and 3B. FIG. 3B is a top view of a lighting device. FIG. 3A is a cross-sectional view taken along a line c-d in FIG. 3B.

In the lighting device in this embodiment, a first electrode 401 is formed over a supporting substrate 400 which is a support. The first electrode 401 corresponds to the first electrode 101 in Embodiment 1. In the case where the lighting device is a bottom emission type, a light-transmitting material such as glass, quartz, or an organic resin can be used as a material for the supporting substrate 400. In the case where the lighting device is a top emission type, the supporting substrate 400 does not necessarily have a light-transmitting property, and a material such as a metal, a semiconductor, ceramics, or a colored organic resin can be used other than the above materials. In the case where a conductive substrate is used, the substrate preferably has an insulating surface by a method such as oxidation of its surface or formation of an insulating film on its surface.

In the case where an organic resin is used for the supporting substrate 400, for example, any of the following can be used as the organic resin: polyester resins such as poly(ethylene terephthalate) (PET) and poly(ethylene naphthalate) (PEN), a polyacrylonitrile resin, a polyimide resin, a poly(methyl methacrylate) resin, a polycarbonate (PC) resin, a polyethersulfone (PES) resin, a polyamide resin, a polycycloolefin resin, a polystyrene resin, a polyamide imide resin, a polyvinyl chloride) resin, and the like. A substrate in which a glass fiber is impregnated with an organic resin or a substrate in which an inorganic filler is mixed with an organic resin can also be used.

In particular, in the case where the light-emitting device is a so-called top emission light-emitting device in which light is extracted from a sealing substrate 407 side, a substrate having high thermal conductivity, such as a metal substrate, is preferably used as the supporting substrate 400. In the case of a large light-emitting device including an EL element, heat from the EL element causes a problem in some cases; therefore, heat dissipation can be increased with the use of such a substrate having high thermal conductivity. For example, when a substrate of aluminum, duralumin, or the like is used other than a stainless steel substrate, light weight and high thermal dissipation can be achieved. A stack of aluminum and aluminum oxide, a stack of duralumin and aluminum oxide, a stack of duralumin and magnesium oxide, or the like is preferably used, in which case the surface of the substrate can have an insulating property.

An EL layer 403 is formed over the first electrode 401. The EL layer 403 corresponds to the EL layer 103 in Embodiment 1 or Embodiment 2. Therefore, the description in Embodiment 1 or Embodiment 2 can be referred to. Note that the EL layer 403 is preferably formed to be slightly larger than the first electrode 401 when seen from above, in which case the EL layer 403 can also serve as an insulating layer that suppresses a short circuit between the first electrode 401 and the second electrode 404.

Then, the second electrode 404 is formed so as to cover the EL layer 403. The second electrode 404 corresponds to the second electrode 102 and has a structure described in Embodiment 1. In this embodiment, the second electrode 404 is connected to a pad 412, whereby voltage is applied.

As described above, the lighting device described in this embodiment includes a light-emitting element including the first electrode 401, the EL layer 403, and the second electrode 404. The light-emitting element has a resonant structure for a plurality of wavelengths; thus, the lighting device in this embodiment can have an excellent color temperature. The lighting device can also have low power consumption. Further, the resonant structure for a plurality of wavelengths can be formed by a single element structure without forming a plurality of elements having different resonant structures; thus, a lighting device with an excellent color temperature can be obtained easily.

A sealing substrate 407 is fixed with sealing materials 405 and 406 so that the light-emitting element having the above structure is sealed; thus, the lighting device is completed. It is possible to use only either the sealing material 405 or the sealing material 406. The inner sealing material 406 can be mixed with a desiccant, whereby moisture can be adsorbed, which results in an improvement in the reliability. The space 408 surrounded by the sealing substrate 407, the supporting substrate 400 over which the light-emitting element is formed, and the sealing materials 405 and 406 may be in a reduced pressure atmosphere. Alternatively, the space 408 may be filled with a gas such as air which does not contain moisture and oxygen or dry nitrogen, or a liquid or a solid such as a sealing material.

When parts of the pad 412 and the first electrode 401 are extended to the outside of the sealing materials 405 and 406, the extended parts can serve as external input terminals. An IC chip 420 mounted with a converter or the like may be provided over the external input terminals.

Note that an epoxy-based resin or glass frit is preferably used as the sealing material 405. It is desirable that such a material do not transmit moisture or oxygen as much as possible. As the sealing substrate 407, a plastic substrate formed of fiberglass-reinforced plastics (FRP), poly(vinyl fluoride) (PVF), a polyester, an acrylic resin, or the like can be used as well as a glass substrate or a quartz substrate. In the case where glass frit is used as the sealing material, the supporting substrate 400 and the sealing substrate 407 are preferably glass substrates in terms of adhesion.

In the lighting device in this embodiment which includes the light-emitting element having a microcavity structure, which is described in Embodiment 1, emitted light has directivity; for that reason, a structure for diffusing light may be provided on a surface intersecting with emitted light, such as a surface of the lighting device or a bottom surface of the sealing substrate 407. As the structure for diffusing light, for example, a light diffusing film with an uneven structure provided by hemispherical lens, a microlens array, and or the like may be attached, or the uneven shape may be directly provided for the supporting substrate 400 and the sealing substrate 407.

As described above, the lighting device described in this embodiment includes the light-emitting element described in Embodiment 1, and thus can have an excellent color temperature for lighting. The lighting device can also have low power consumption. The lighting device can also be inexpensive.

Embodiment 4

In this embodiment, lighting devices each including a light-emitting device manufactured according to one embodiment of the present invention will be described with reference to FIG. 4 and FIG. 5.

Figure 4:
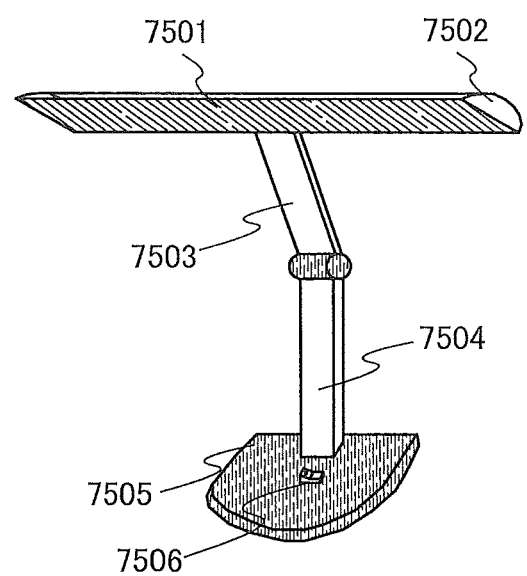
FIG. 4 illustrates a lighting device according to one embodiment of the present invention.

FIG. 4 illustrates a lighting device (desk lamp), which includes a lighting portion 7501, a shade 7502, an adjustable arm 7503, a support 7504, a base 7505, and a power switch 7506. Note that the lighting device is manufactured using a light-emitting device, which is manufactured according to an embodiment of the present invention, for the lighting portion 7501. Note that the lighting device includes, in its category, ceiling lights (ceiling-fixed lighting devices), wall lights (wall-hanging lighting devices), and the like in addition to the desk lamp illustrated in FIG. 4.

A lighting device manufactured according to one embodiment of the present invention has high reliability and a high manufacturing yield. Therefore, when the lighting device is used for the lighting portion 7501 of the lighting device, the lighting device can have high reliability and can be highly price-competitive. Further, a lighting device manufactured according to one embodiment of the present invention can have low power consumption.

Figure 5:
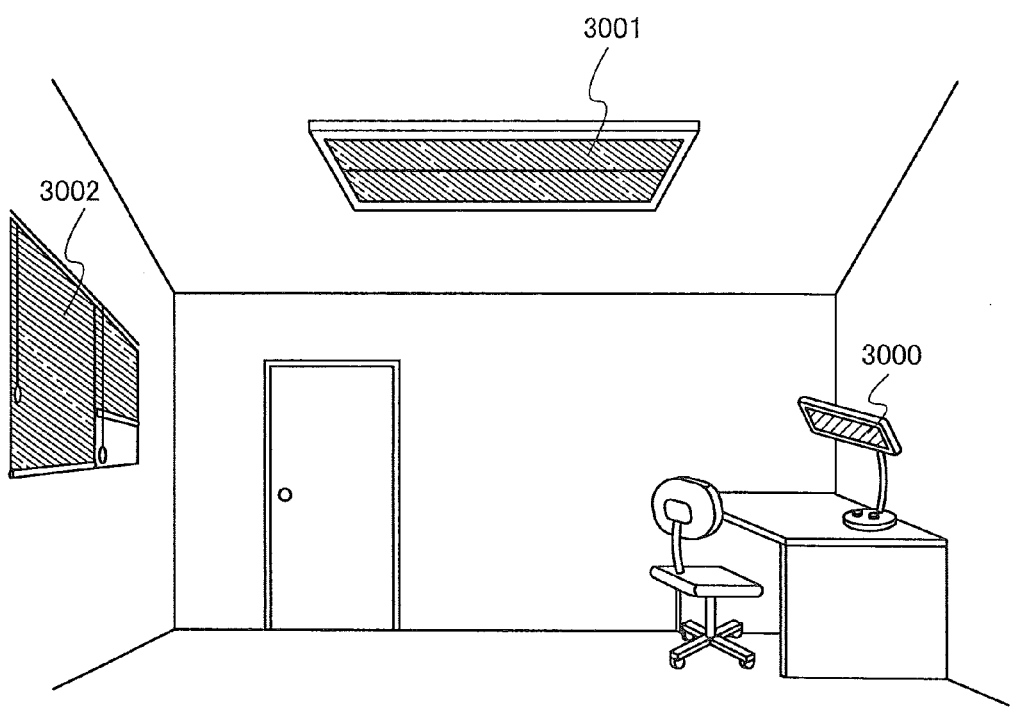
FIG. 5 illustrates lighting devices according to one embodiment of the present invention.

FIG. 5 illustrates examples in each of which a light-emitting device manufactured according to one embodiment of the present invention is used as an interior lighting device in addition to the desk lamp 3000. The light-emitting device according to one embodiment of the present invention has high reliability and a high manufacturing yield, and thus can be preferably used for a large-area lighting device such as a ceiling light 3001. In addition, the light-emitting device can be used for a wall-hanging light 3002. Further, a lighting device manufactured according to one embodiment of the present invention can have low power consumption.

Example 1

In this example, the light-emitting element described in Embodiment 1, which is one embodiment of the present invention, will be described. Shown below are molecular structures of organic compounds used in this example.

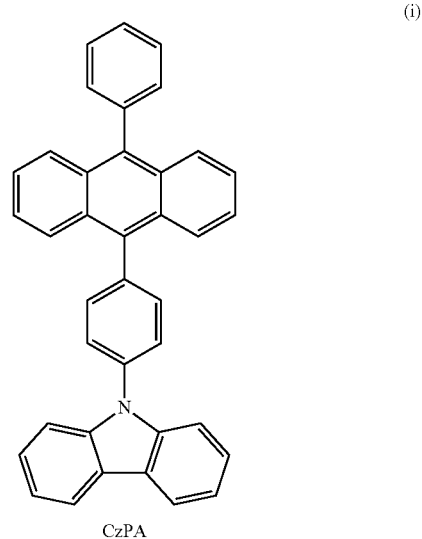

CzPA (i)

(ii)
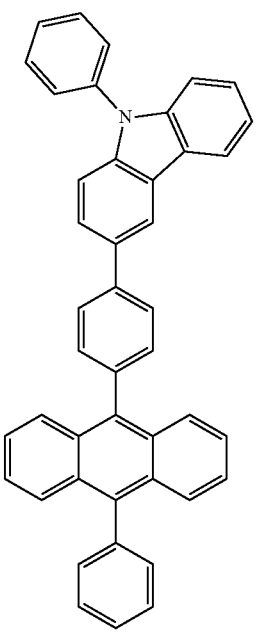
PCzPA
(iii)
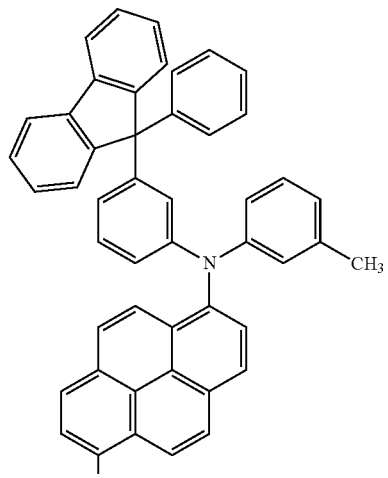
1,6mMemFLPAPrn
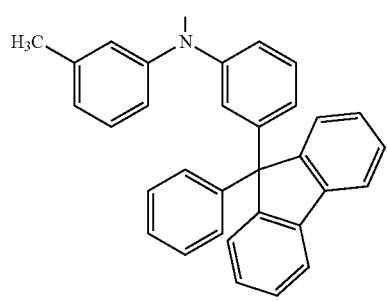
(iv)
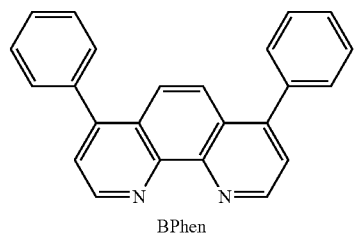
BPhen
(v)
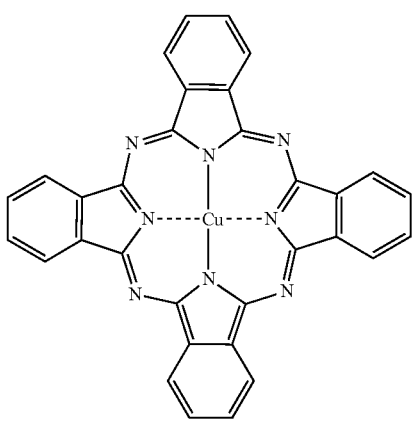
CuPc
(vi)
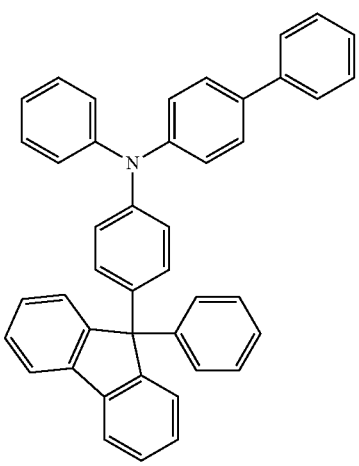
BPAFLP
(vii)
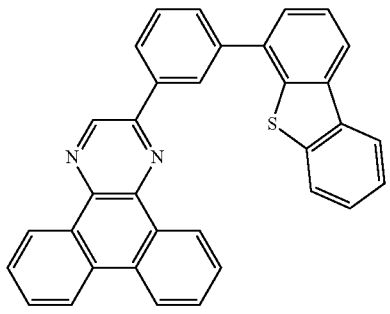
2mDBTPDBq-II -continued

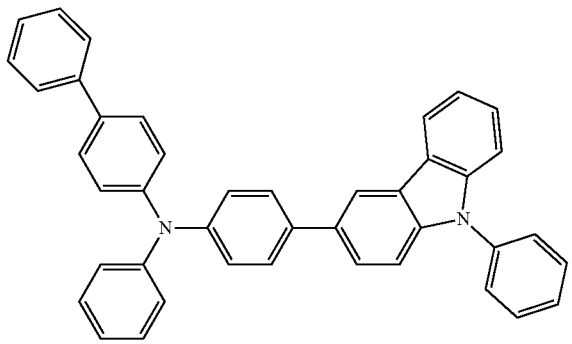

PCBA1BP (viii)

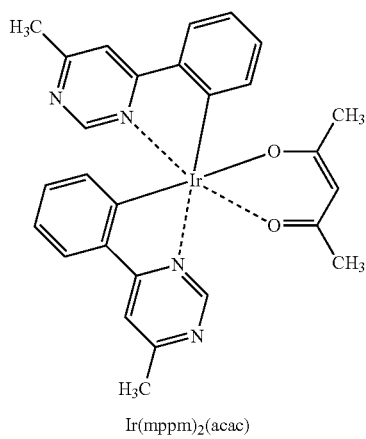

Ir(mppm)$_2$(acac)

(ix)

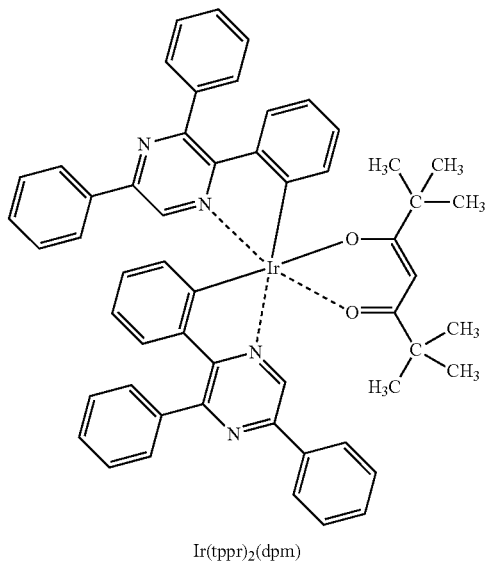

Ir(tppr)$_2$(dpm)

(x)

<<Manufacture of Light-Emitting Element>>

First, as a first electrode, an aluminum-titanium alloy (Al—Ti) and titanium (Ti) are successively deposited by a sputtering method to form a reflective electrode layer. The aluminum-titanium alloy and the titanium were deposited to a thickness of 200 nm and 6 nm, respectively. After the deposition of titanium, heating was performed at 300° C. for one hour, whereby a layer containing titanium oxide was formed. Then, indium tin oxide containing silicon oxide (ITSO) was deposited to a thickness of 70 nm to form a thickness adjustment layer. The periphery of a surface of the thickness adjustment layer was covered with a polyimide film so that an area of 2 mm×2 mm of the surface was exposed, whereby the electrode area was 2 mm×2 mm. As pretreatment for forming a light-emitting element over a substrate, the surface of the substrate was washed with water and baked at 200° C. for one hour, and then a UV ozone treatment was performed for 370 seconds. After that, the substrate was transferred into a vacuum evaporation apparatus whose pressure was reduced to about $10^{-4}$ Pa, vacuum baking was performed at 170° C. in a heating chamber of the vacuum evaporation apparatus for 30 minutes, and then the substrate was cooled down for about 30 minutes.

Next, the substrate was fixed to a holder provided in the vacuum evaporation apparatus such that the surface of the substrate provided with ITSO faced downward.

After the pressure in the vacuum apparatus was reduced to $10^{-4}$ Pa, PCzPA represented by the above structural formula (ii) and molybdenum(VI) oxide were co-evaporated by adjusting the evaporation rates such that the weight ratio of PCzPA to molybdenum oxide was 1:0.5, whereby a hole-injection layer also serving as a thickness adjustment layer was formed. The thickness of the hole-injection layer was 30 nm Note that a co-evaporation method is an evaporation method in which a plurality of different substances is vaporized from respective different evaporation sources.

Next, PCzPA was evaporated to a thickness of 20 nm to form a first hole-transport layer.

Further, on the first hole-transport layer, CzPA represented by the above structural formula (i) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the above structural formula (iii) were evaporated to a thickness of 30 nm by adjusting the evaporation rates such that the weight ratio of CzPA to 1,6mMemFLPAPrn was 1:0.05, whereby a first light-emitting layer was formed.

Next, on the first light-emitting layer, CzPA was evaporated to a thickness of 5 nm, whereby a first electron-transport layer was formed, and then BPhen represented by the above structural formula (iv) was evaporated to a thickness of 15 nm, whereby a second electron-transport layer was formed.

Further, 1 nm thick calcium was formed as an electron-injection buffer layer on the second electron-transport layer by evaporation, and then 2 nm thick CuPc represented by the above structural formula (v) was formed as an electron-relay layer by evaporation. Further, PCzPA and molybdenum(VI) oxide were co-evaporated on the electron-relay layer so that the weight ratio of PCzPA to molybdenum oxide was 1:0.5, whereby a charge generation layer was formed. The thickness of the charge generation layer was 30 nm Note that the charge generation layer also serves as a thickness adjustment layer.

Next, BPAFLP represented by the above structural formula (vi) was evaporated to a thickness of 20 nm, whereby a second hole-transport layer was formed.

Further, 2-[3-(dibenzothiophen-4-yl)phenyl]dibenzo[f,h]quinoxaline (abbreviation: 2mDBTPDBq-II) represented by the above structural formula (vii), 4-phenyl-4'-(9-phenyl-9H-carbazol-3-yl)triphenylamine (abbreviation: PCBA1BP) represented by the structural formula (viii), and (acetylacetonato)bis(6-methyl-4-phenylpyrimidinato)iridium(III) (abbreviation: Ir(mppm)$_2$(acac)) represented by the above structural formula (ix) were co-evaporated so that the weight ratio of 2mDBTPDBq-II to PCBA1BP and Ir(mppm)$_2$(acac)

was 0.8:0.2:0.06, whereby a second light-emitting layer was formed. The thickness of the second light-emitting layer was 20 nm.

Next, 2mDBTPDBq-II and (dipivaloylmethanato)bis(2,3,5-triphenylpyrazinato)iridium(III) (abbreviation: Ir(tppr)$_2$(dpm)) represented by the above structural formula (x) were co-evaporated so that the weight ratio of 2mDBTPDBq-II to Ir(tppr)$_2$(dpm) was 1:0.02, whereby a third light-emitting layer was formed. The thickness of the third light-emitting layer was 20 nm.

After that, 15 nm thick 2mDBTPDBq-II was formed to form a third electron-transport layer, and then 15 nm thick BPhen was formed to form a fourth electron-transport layer.

After that, 1 nm thick lithium fluoride was formed on the fourth electron-transport layer by evaporation to form an electron-injection layer. On the electron-injection layer, a film containing silver and magnesium was formed to a thickness of 10 nm so that the volume ratio of silver to magnesium was 10:1, and then 50 nm thick ITSO was formed to form a second electrode. Through the above steps, a light-emitting element 1 was manufactured.

Table 1 shows an element structure of the light-emitting element 1.

Figure 10:
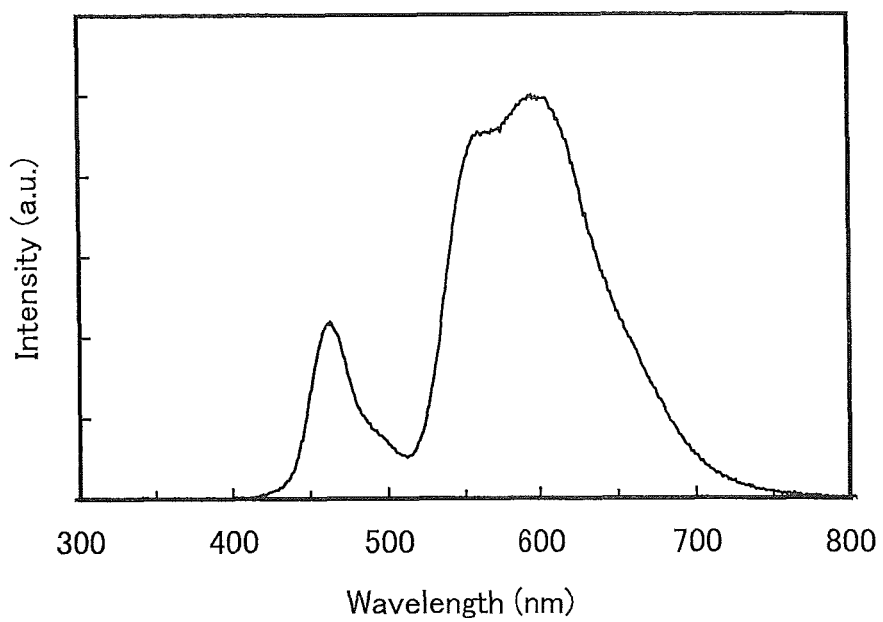
FIG. 10 shows an emission spectrum of the light-emitting element 1.
Figure 11:
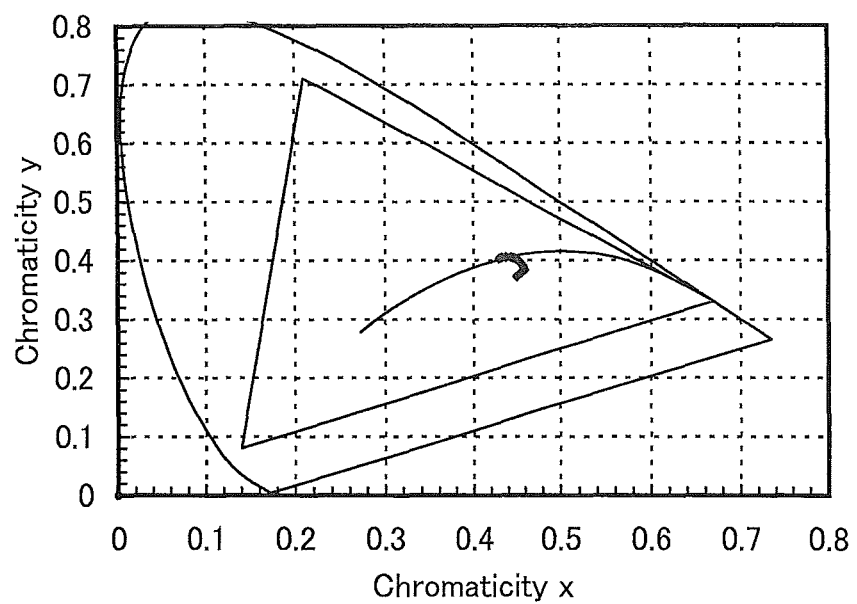
FIG. 11 is CIE chromaticity coordinates of the light-emitting element 1.

In the light-emitting element 1 in this example, the reflective electrode is the aluminum-titanium alloy, and a semi-reflective surface is an interface between the ITSO and the air; therefore, the optical thickness L between these electrodes is 664 nm From the equation L=nλ/2, when n is 2, λ is 664, and when n is 3, λ is 443; accordingly, the resonant wavelengths of the light-emitting element 1 are 664 nm and 443 nm According to FIG. 10, the light-emitting element 1 has peaks at the resonant wavelengths, and thus is a light-emitting element having a resonant structure for a plurality of wavelengths. FIG. 11 is the CIE 0.1931 chromaticity coordinates of the light-emitting element 1. In the diagram, dots each correspond to chromaticity of the light-emitting element at each measuring voltage. The light-emitting element 1 in this example has a resonant structure for a plurality of wavelengths, and therefore emits light of a color with a color temperature suitable for application to lighting.

Reference Example

In this reference example, the materials used for the light-emitting element 1 in the example will be described.

TABLE 1

| Al—Ti | Ti | NITO | PCzPA:MoOx 1:0.5 | PCzPA | CzPA:1,6-mMemFLPAPrn 1:0.05 | CzPA | Bphen |
|---|---|---|---|---|---|---|---|
| 200 nm | 6 nm | 70 nm | 30 nm | 20 nm | 30 nm | 5 nm | 15 nm |

| Ca | CuPc | PCzPA:MoOx 1:0.5 | BPAFLP | 2mDBTPDBqII:PCBA1BP:Ir(mppm)$_2$(acac) 0.8:0.2:0.06 | 2mDBTPDBqII:Ir(tppr)$_2$(dpm) 1:0.02 |
|---|---|---|---|---|---|
| 1 nm | 2 nm | 30 nm | 20 nm | 20 nm | 20 nm |

| 2mDBTPDBqII | Bphen | LiF | Ag:Mg 10:1 | ITO |
|---|---|---|---|---|
| 15 nm | 15 nm | 1 nm | 10 nm | 50 nm |

<<Operating Characteristics of Light-Emitting Element 1>>

The light-emitting element 1 thus obtained was sealed in a glove box under a nitrogen atmosphere without being exposed to the air. After that, the operating characteristics of the light-emitting element were evaluated. Note that the measurement was carried out at room temperature (in an atmosphere kept at 25° C.).

Figure 6:
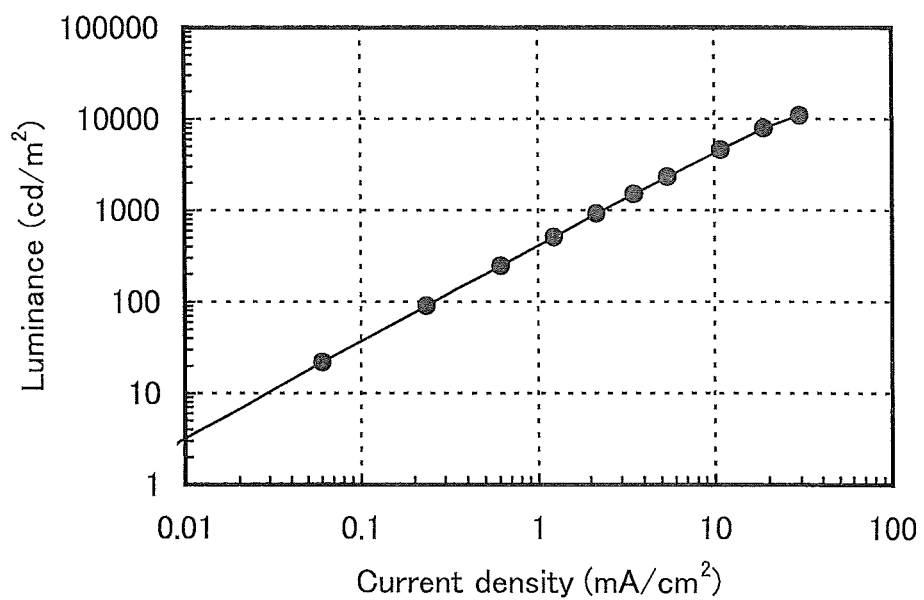
FIG. 6 shows luminance-current density characteristics of a light-emitting element 1.
Figure 7:
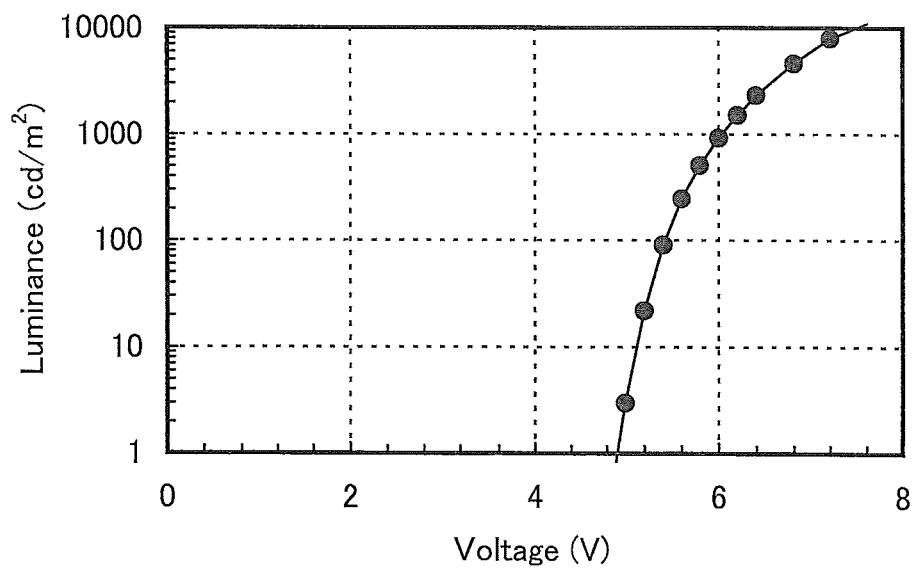
FIG. 7 shows luminance-voltage characteristics of the light-emitting element 1.
Figure 8:
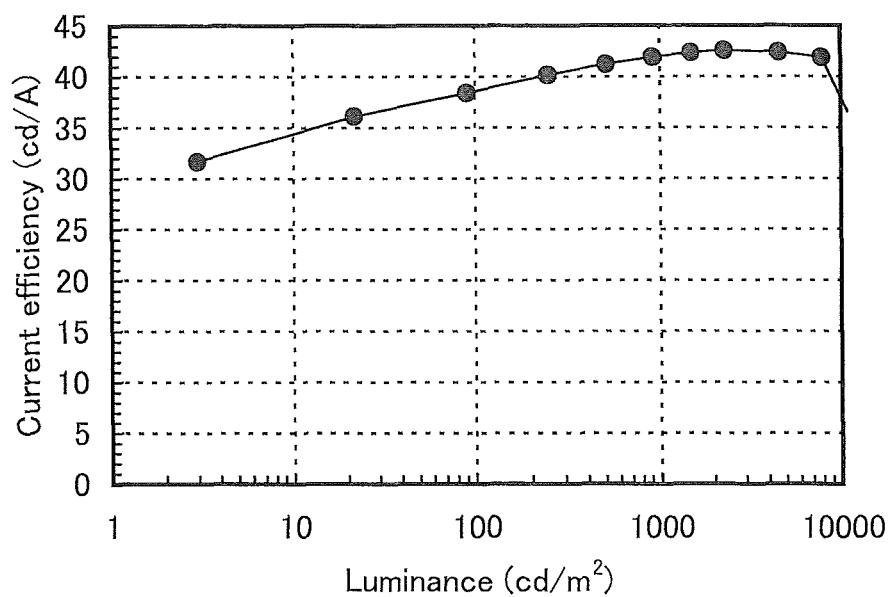
FIG. 8 shows current efficiency-luminance characteristics of the light-emitting element 1.
Figure 9:
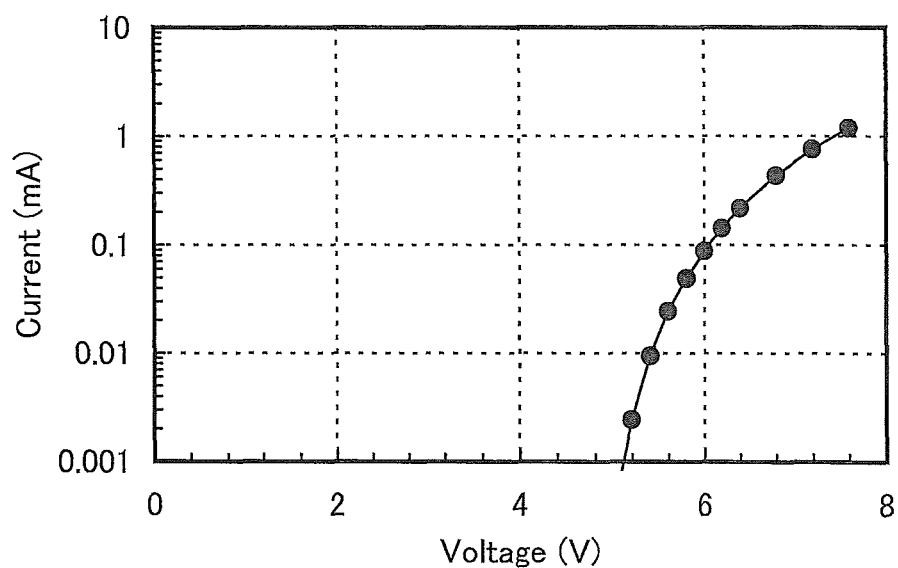
FIG. 9 shows current-voltage characteristics of the light-emitting element 1.

FIG. 6 shows the luminance (cd/m$^2$)-current density (mA/cm$^2$) characteristics of the light-emitting element 1. FIG. 7 shows the luminance (cd/m$^2$)-voltage (V) characteristics of the light-emitting element 1. FIG. 8 shows the current efficiency (cd/A)-luminance (cd/m$^2$) characteristics. FIG. 9 shows the current (mA)-voltage (V) characteristics of the light-emitting element 1. Table 2 shows the main characteristics of the light-emitting element 1 at a luminance around 1000 cd/m$^2$.

TABLE 2

| Voltage | Current | Current density | Chromaticity | | Current efficiency | Power efficiency |
|---|---|---|---|---|---|---|
| (V) | (mA) | (mA/cm$^2$) | x | y | (cd/A) | (lm/W) |
| 6.0 | 0.09 | 2.19 | 0.45 | 0.40 | 41.9 | 21.9 |

FIG. 10 shows an emission spectrum when a current of 0.1 mA flows to the light-emitting element 1. In FIG. 10, the vertical axis represents emission intensity and the horizontal axis represents emission wavelength (nm).

Synthesis Example of 1,6mMemFLPAPrn

A synthesis example of 1,6mMemFLPAPrn, which was used as a material for the light-emitting element 1, will be described.

Step 1: Synthesis Method of 3-methylphenyl-3-(9-phenyl-9H-fluoren-9-yl)phenylamine (abbreviation: mMemFLPA)

In a 200 mL three-neck flask were put 3.2 g (8.1 mmol) of 9-(3-bromophenyl)-9-phenylfluorene and 2.3 g (24.1 mmol) of sodium tert-butoxide. The air in the flask was replaced with nitrogen. To this mixture were added 40.0 mL of toluene, 0.9 mL (8.3 mmol) of m-toluidine, and 0.2 mL of a 10% hexane solution of tri(tert-butyl)phosphine. The temperature of this mixture was set to 60° C., and 44.5 mg (0.1 mmol) of bis(dibenzylideneacetone)palladium(0) was added to the mixture. The mixture was stirred at 80° C. for 2.0 hours. After the stirring, the mixture was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 1:1 ratio of hexane to toluene). Recrystallization from a mixed solvent of toluene and hexane was performed.

Accordingly, 2.8 g of a white solid which was a target substance was obtained in a yield of 82%. The synthesis scheme of Step 1 is shown in (A-1) below.

(A-1)

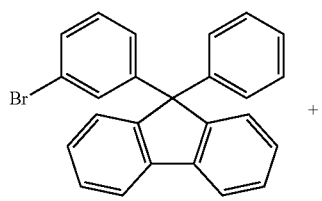

+

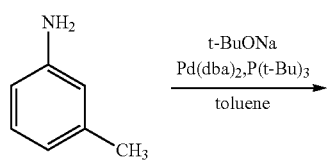

Step 2: Synthesis Method of 1,6mMemFLPAPrn

In a 100 mL three-neck flask were put 0.6 g (1.7 mmol) of 1,6-dibromopyrene, 1.4 g (3.4 mmol) of mMemFLPA, and 0.5 g (5.1 mmol) of sodium tert-butoxide. The air in the flask was replaced with nitrogen. To this mixture were added 21.0 mL of toluene and 0.2 mL of a 10% hexane solution of tri(tert-butyl)phosphine. The temperature of this mixture was set to 60° C., and 34.9 mg (0.1 mmol) of bis(dibenzylideneacetone)palladium(0) was added to the mixture. The mixture was stirred at 80° C. for 3.0 hours. After the stirring, 400 mL of toluene was added to the mixture, and the mixture was heated. While the mixture was kept hot, it was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 3:2 ratio of hexane to toluene) to give a yellow solid. Recrystallization of the obtained yellow solid from a mixed solvent of toluene and hexane gave 1.2 g of a yellow solid, which was a target substance, in a yield of 67%.

By a train sublimation method, 1.0 g of the obtained yellow solid was purified. In the purification, the yellow solid was heated at 317° C. under a pressure of 2.2 Pa with a flow rate of argon gas of 5.0 mL/min. After the purification, 1.0 g of a yellow solid, which was a target substance, was obtained in a yield of 93%. The synthesis scheme of Step 2 is shown in (A-2) below.

(A-2)

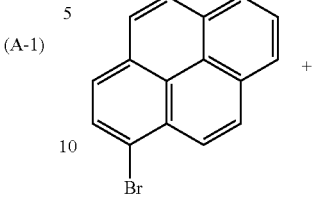

+

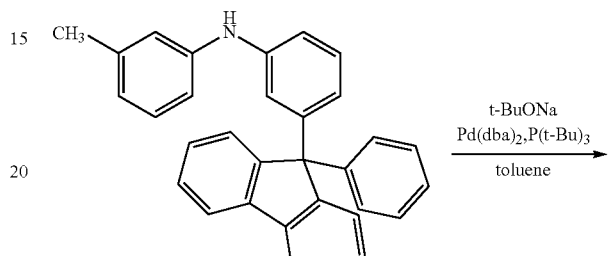

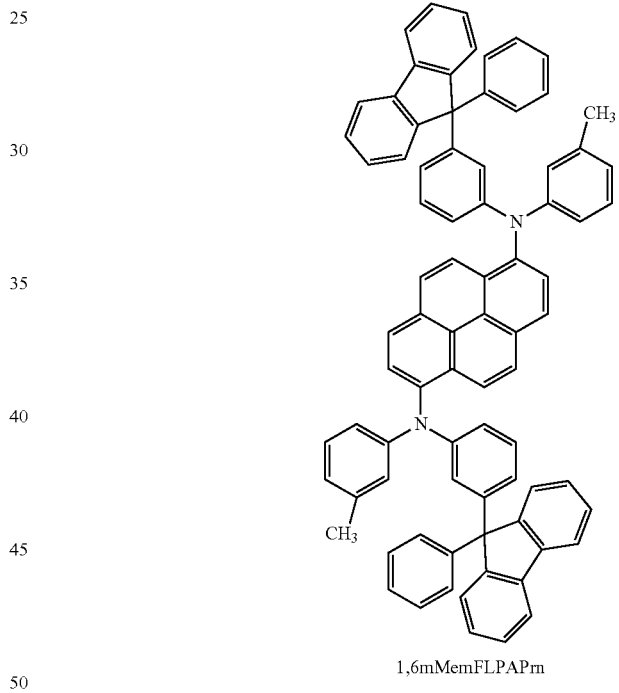

1,6mMemFLPAPrn

A nuclear magnetic resonance (NMR) method identified this compound as 1,6mMemFLPAPrn, which was the object of the synthesis.

$^1$H NMR data of the obtained compound are shown below. $^1$H NMR (CDCl$_3$, 300 MHz): δ=2.21 (s, 6H), 6.67 (d, J=7.2 Hz, 2H), 6.74 (d, J=7.2 Hz, 2H), 7.17-7.23 (m, 34H), 7.62 (d, J=7.8 Hz, 4H), 7.74 (d, J=7.8 Hz, 2H), 7.86 (d, J=9.0 Hz, 2H), 8.04 (d, J=8.7 Hz, 4H).

Synthesis Example of 2mDBTPDBq-II

A synthesis method of 2mDBTPDBq-II, which was used as a material for the light-emitting element 1, will be described.

Synthesis of 2mDBTPDBq-II

The synthesis scheme of 2mDBTPDBq-II is shown in (B-1).

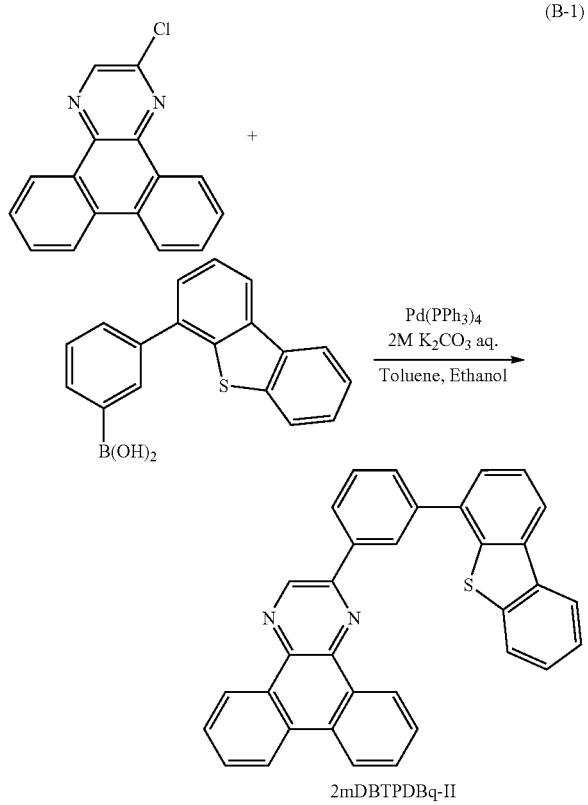

(B-1)

2mDBTPDBq-II

In a 2 L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous potassium carbonate solution. The mixture was degassed by being stirred under reduced pressure, and the air in the flask was replaced with nitrogen. This mixture was stirred at 100° C. under a nitrogen stream for 7.5 hours. After cooled to room temperature, the obtained mixture was filtered to give a white residue. The obtained residue was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135) to give a clear colorless filtrate. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of white powder, which was a target substance, in a yield of 80%.

By a train sublimation method, 4.0 g of the obtained white powder was purified. In the purification, the white powder was heated at 300° C. under a pressure of 5.0 Pa with a flow rate of argon gas of 5 mL/min. After the purification, 3.5 g of white powder, which was a target substance, was obtained in a yield of 88%.

The NMR identified this compound as 2mDBTPDBq-II, which was a target substance.

$^1$H NMR data of the obtained substance are shown below.
$^1$H NMR (CDCl$_3$, 300 MHz): δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

Synthesis Example of [Ir(mppm)$_2$(acac)]

A synthesis example of Ir(mppm)$_2$(acac), which was used as a material for the light-emitting element 1, will be described.

Step 1: Synthesis of 4-methyl-6-phenylpyrimidine (abbreviation: Hmppm)

First, in a recovery flask equipped with a reflux pipe were put 4.90 g of 4-chloro-6-methylpyrimidine, 4.80 g of phenylboronic acid, 4.03 g of sodium carbonate, 0.16 g of bis(triphenylphosphine)palladium(II) dichloride (abbreviation: Pd(PPh$_3$)$_2$Cl$_2$), 20 mL of water, and 10 mL of acetonitrile, and the air in the flask was replaced with argon. This reaction container was subjected to irradiation with microwaves (2.45 GHz, 100 W) for one hour to be heated. In the flask were further put 2.28 g of phenylboronic acid, 2.02 g of sodium carbonate, 0.082 g of Pd(PPh$_3$)$_2$Cl$_2$, 5 mL of water, and 10 mL of acetonitrile, and the mixture was heated again by irradiation with microwaves (2.45 GHz, 100 W) for one hour. After that, water was added to this solution and extraction with dichloromethane was carried out. The obtained solution of the extract was washed with a saturated sodium carbonate aqueous solution, water, and then with saturated saline, and dried with magnesium sulfate. The solution after drying was filtered. The solvent of this solution was distilled off, and then the obtained residue was purified by silica gel column chromatography using dichloromethane and ethyl acetate as a developing solvent in a volume ratio of 9:1, so that a pyrimidine derivative Hmppm, which was a target substance, was obtained (orange oily substance, yield of 46%). Note that the irradiation with microwaves was performed with a microwave synthesis system (Discover, produced by CEM Corporation). The synthesis scheme of Step 1 is shown in (C-1).

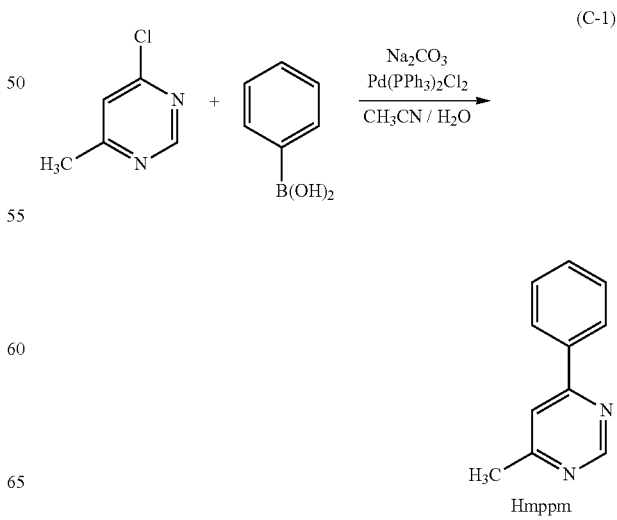

(C-1)

Hmppm

Step 2: Synthesis of di-μ-chloro-bis[bis(6-methyl-4-phenylpyrimidinato)iridium(III)] (abbreviation: [Ir(mppm)$_2$Cl]$_2$)

Next, in a recovery flask equipped with a reflux pipe were put 15 mL of 2-ethoxyethanol, 5 mL of water, 1.51 g of Hmppm obtained in Step 1, and 1.26 g of iridium chloride hydrate (IrCl$_3$.H$_2$O), and the air in the recovery flask was replaced with argon. After that, irradiation with microwaves (2.45 GHz, 100 W) was performed for one hour. The solvent was distilled off, and then the obtained residue was washed with ethanol and filtered to give a dinuclear complex [Ir(mppm)$_2$Cl]$_2$ (dark green powder, yield of 77%). The synthesis scheme of Step 2 is shown in (C-2).

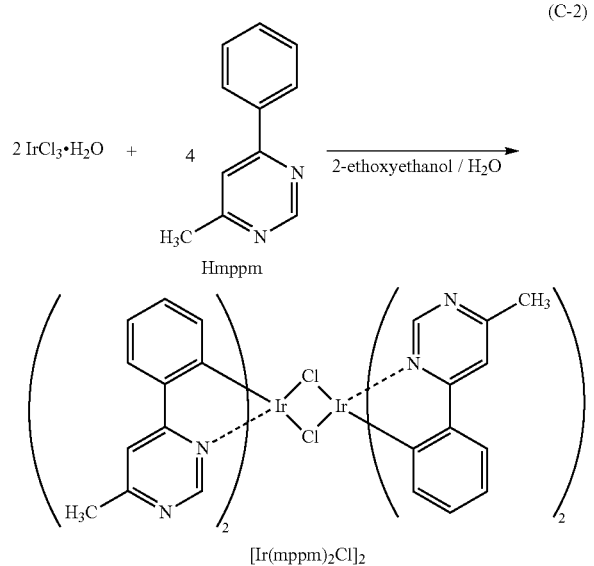

(C-2)

Step 3: Synthesis of Ir(mppm)$_2$(acac)

In a recovery flask equipped with a reflux pipe were put 40 mL of 2-ethoxyethanol, 1.84 g of the dinuclear complex [Ir(mppm)$_2$Cl]$_2$ obtained in Step 2, 0.48 g of acetylacetone, and 1.73 g of sodium carbonate, and the air in the recovery flask was replaced with argon. After that, irradiation with microwaves (2.45 GHz, 100 W) was performed for one hour. The solvent was distilled off, the obtained residue was dissolved in dichloromethane, and filtration was performed to remove insoluble part. The obtained filtrate was washed with water and saturated saline, and was dried with magnesium sulfate. The solution after the drying was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane to give yellow powder which was a target substance (yield of 44%). The synthesis scheme of Step 3 is shown in (C-3).

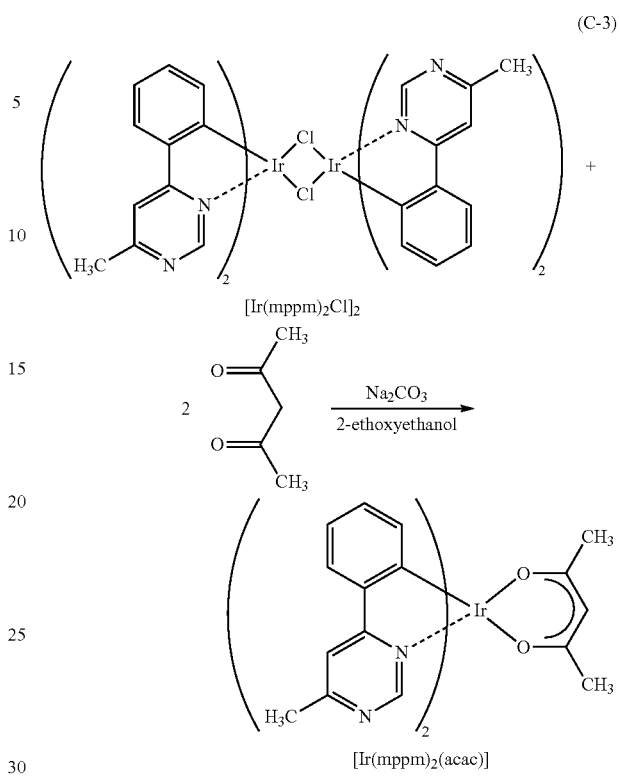

(C-3)

The analysis result by $^1$H NMR of the yellow powder obtained in Step 3 is described below. The result shows that this compound was Ir(mppm)$_2$(acac), which was a target substance.

$^1$H-NMR. δ (CDCl$_3$): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

This application is based on Japanese Patent Application serial no. 2011-102547 filed with the Japan Patent Office on Apr. 29, 2011, the entire contents of which are hereby incorporated by reference.

What is claimed is:
1. A light-emitting element comprising:
a first substrate;
a first metal electrode over the first substrate, the first metal electrode comprising titanium;
a conductive metal oxide layer over and in electrical contact with the first metal electrode, the conductive metal oxide layer comprising indium and tin,
a first light-emitting layer over the conductive metal oxide layer;
a second light-emitting layer over the first light-emitting layer; and
a second metal electrode over the second light-emitting layer,
wherein the first metal electrode is configured to function as an anode, and
wherein the first light-emitting layer and the second light-emitting layer are different in emission color from each other, and
wherein an optical path length L between a bottom surface of the conductive metal oxide layer and a bottom surface of the second metal electrode is between 650 nm and 1500 nm.

2. The light-emitting element according to claim 1, further comprising a charge generation layer between the first light-emitting layer and the second light-emitting layer.

3. The light-emitting element according to claim 1, wherein the second metal electrode comprises at least one of silver and magnesium.

4. The light-emitting element according to claim 1, wherein the first light-emitting layer and the second light-emitting layer overlap with the first metal electrode.

5. The light-emitting element according to claim 1, further comprising a layer between the conductive metal oxide layer and the first light-emitting layer,
wherein the layer comprises a material having a hole-transport property.

6. The light-emitting element according to claim 1, wherein the optical path length is 1200 nm to 1400 nm.

7. The light-emitting element according to claim 1, further comprising a second substrate over the second metal electrode,
wherein a space between the second metal electrode and the second substrate is filled with a solid.

8. A lighting device comprising the light-emitting element according to claim 1.

9. A light-emitting element comprising:
a first substrate;
a first metal electrode over the first substrate, the first metal electrode comprising molybdenum;
a conductive metal oxide layer over and in electrical contact with the first metal electrode, the conductive metal oxide layer comprising indium and tin,
a first light-emitting layer over the conductive metal oxide layer;
a second light-emitting layer over the first light-emitting layer; and
a second metal electrode over the second light-emitting layer,
wherein the first metal electrode is configured to function as an anode, and
wherein the first light-emitting layer and the second light-emitting layer are different in emission color from each other, and
wherein an optical path length L between a bottom surface of the conductive metal oxide layer and a bottom surface of the second metal electrode is between 650 nm and 1500 nm.

10. The light-emitting element according to claim 9, further comprising a charge generation layer between the first light-emitting layer and the second light-emitting layer.

11. The light-emitting element according to claim 9, wherein the second metal electrode comprises at least one of silver and magnesium.

12. The light-emitting element according to claim 9, wherein the first light-emitting layer and the second light-emitting layer overlap with the first metal electrode.

13. The light-emitting element according to claim 9, further comprising a layer between the conductive metal oxide layer and the first light-emitting layer,
wherein the layer comprises a material having a hole-transport property.

14. The light-emitting element according to claim 9, wherein the optical path length is 1200 nm to 1400 nm.

15. The light-emitting element according to claim 9, further comprising a second substrate over the second metal electrode,
wherein a space between the second metal electrode and the second substrate is filled with a solid.

16. A lighting device comprising the light-emitting element according to claim 9.

* * * * *

UNITED STATES PATENT AND TRADEMARK OFFICE
CERTIFICATE OF CORRECTION

PATENT NO.        : 9,559,325 B2
APPLICATION NO.   : 14/794512
DATED             : January 31, 2017
INVENTOR(S)       : Nobuharu Ohsawa et al.

It is certified that error appears in the above-identified patent and that said Letters Patent is hereby corrected as shown below:

In the Specification

Column 3, Line 8; Change "fainted" to --formed--.

Column 8, Line 16; Change "(4-{N-[4" to --(4-{N'-[4--.

Column 12, Line 1; Change "lengths 2 which" to --lengths λ which--.

Column 12, Line 48; Change "Spiro" to --spiro--.

Column 13, Line 7; Change "N,N" to --N,N'--.

Column 13, Line 17; Change "N,N'" to --N,N''--.

Column 13, Line 18; Change "N,N',N''" to --N,N',N'--.

Column 13, Line 22; Change "N,N,N" to --N,N',N'--.

Column 13, Line 23; Change "N,N,N',N',N'',N'',N'',N'''" to --N,N,N',N',N'',N'',N''',N'''--.

Column 13, Line 29; Change "N,N',N''" to --N,N',N'--.

Column 13, Line 35; Change "N,N-triphenylanthracen" to --N,N,9-triphenylanthracen--.

Column 13, Line 51; Change "benzo[    ]quinolizin" to --benzo[i,j]quinolizin--.

Column 13, Line 59; Change "$C^2$]" to --$C^{2'}$]--.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,559,325 B2

Column 13, Line 65; Change "C²]" to --C²]--.

Column 14, Line 14; Change "[4,5-a]" to --[4,5-α]--.

Column 14, Line 14; Change "C³]" to --C³]--.

Column 16, Line 45; Change "polyvinyl      chloride)" to --polyvinyl(chloride)--.

Column 19, Lines 33 to 66, formula (iii); Change

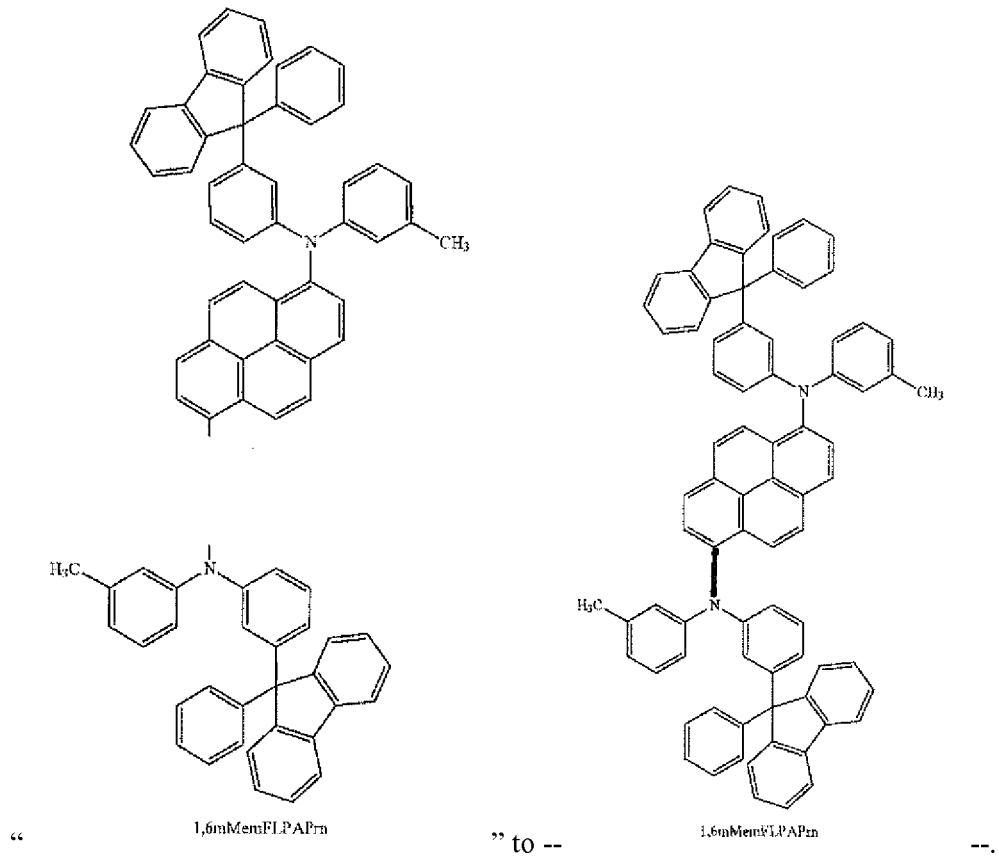

Column 22, Line 25; Change "30 nm Note" to --30 nm. Note--.

Column 22, Line 53; Change "30 nm Note" to --30 nm. Note--.

Column 24, Line 5; Change "664 nm From" to --664 nm. From--.

Column 24, Line 8; Change "443 nm According" to --443 nm. According--.

Column 24, Line 11; Change "CIE 0.1931" to --CIE 1931--.

Column 29, Line 8; Change "(IrCl₃.H₂O)," to --(IrCl₃·H₂O),--.

CERTIFICATE OF CORRECTION (continued)
U.S. Pat. No. 9,559,325 B2

Column 30, Lines 20 to 30;
Change

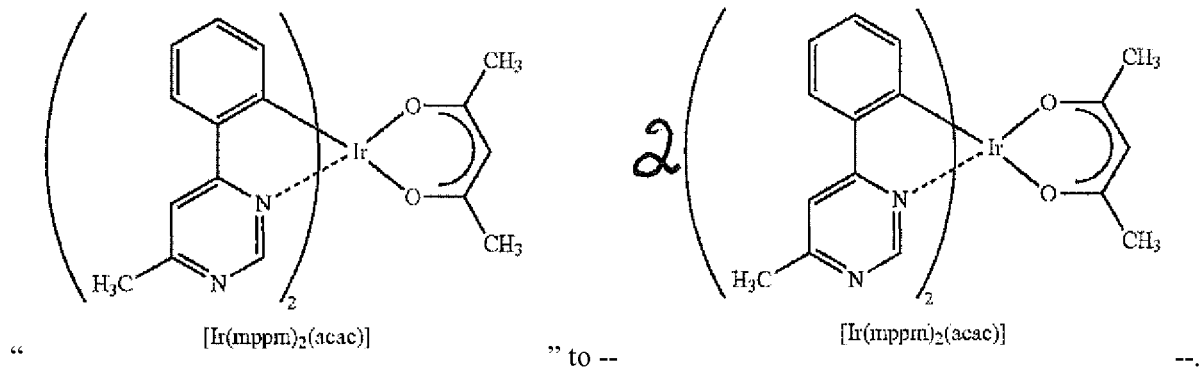

" to -- --.